United States Patent [19]
Saitoh et al.

[11] Patent Number: 5,402,791
[45] Date of Patent: Apr. 4, 1995

[54] PIEZOELECTRIC SINGLE CRYSTAL, ULTRASONIC PROBE, AND ARRAY-TYPE ULTRASONIC PROBE

[75] Inventors: Shiroh Saitoh; Mamoru Izumi, both of Tokyo; Yohachi Yamashita, Yokohama; Senji Shimanuki, Atsugi; Masaru Kawachi, Yokohama; Tsuyoshi Kobayashi, Tokyo, all of Japan

[73] Assignee: Kabushiki Kaisha Toshiba, Kawasaki, Japan

[21] Appl. No.: 285,445

[22] Filed: Aug. 5, 1994

[30] Foreign Application Priority Data

| Aug. 6, 1993 | [JP] | Japan | 5-196224 |
| Aug. 6, 1993 | [JP] | Japan | 5-196225 |
| Aug. 6, 1993 | [JP] | Japan | 5-196227 |
| Aug. 6, 1993 | [JP] | Japan | 5-196228 |
| Aug. 6, 1993 | [JP] | Japan | 5-196230 |

[51] Int. Cl.$^6$ .............................................. A61B 8/00
[52] U.S. Cl. .............................. 128/662.03; 252/62.9; 310/358; 310/313 A
[58] Field of Search ............... 128/660.07, 661.01, 128/662.03; 310/313 A, 334, 358, 366; 252/62.9

[56] References Cited

U.S. PATENT DOCUMENTS

| 4,952,832 | 4/1990 | Imai et al. | 310/313 A |
| 5,169,551 | 12/1992 | Tsunooka et al. | 252/62.9 |
| 5,295,487 | 3/1994 | Saitoh et al. | |
| 5,300,852 | 4/1994 | Isogai et al. | 310/358 |

OTHER PUBLICATIONS

Japanese Journal of Applied Physics, vol. 21, No. 9, Sep. 1982, pp. 1298–1302, J. Kuwata, et al. *Dielectric and Piezoelectric Properties of 0.91Pb(Zn1/3Nb2/3)o3–0.09PbTio3 Single Crystals.*

*Primary Examiner*—George Manuel
*Attorney, Agent, or Firm*—Oblon, Spivak, McClelland, Maier, & Neustadt

[57] ABSTRACT

Disclosed is a piezoelectric single crystal which has a large electromechanical coupling coefficient and hardly brings about depolarization due to the effect of heat in, e.g., the steps of manufacturing an ultrasonic transmitting/receiving element. The piezoelectric single crystal consists essentially of a general formula:

$$Pb\{[M1_{1/3}Nb_{(2/3)-(2z/3)}Ta_{2z/3}]_{1-x-y}Ti_xM2_y\}O_3$$

wherein M1 represents at least one metal selected from the group consisting of Zn, Ni, and Mg, M2 represents at least one metal selected from the group consisting of Pt, Fe, Bi, Rh, and Ir, and x, y, and z are defined as $0.05 \leq x \leq 0.2$, $0.00001 \leq y \leq 0.01$, and $0 \leq z \leq 0.1$, respectively.

26 Claims, 6 Drawing Sheets

PIEZOELECTRIC SINGLE CRYSTAL, ULTRASONIC PROBE, AND ARRAY-TYPE ULTRASONIC PROBE

BACKGROUND OF THE INVENTION

1. Field of the Invention

The present invention relates to a piezoelectric single crystal and an ultrasonic probe which includes a piezoelectric element consisting of the piezoelectric single crystal and is useful as a medical diagnostic apparatus or the like.

2. Description of the Related Art

An ultrasonic probe includes an ultrasonic transmitting/receiving element consisting essentially of a piezoelectric element having a pair of electrodes. The ultrasonic probe emits ultrasonic waves against an object to be inspected and receives echoes reflected by interfaces having different acoustic impedances in the object, thereby forming an image of the internal state of the object. An ultrasonic imaging apparatus incorporating this ultrasonic probe is applied to a medical diagnostic apparatus for inspecting the interior of a human body, or to an inspection apparatus for detecting flaws in a metal welded portion.

Recently, an apparatus has been developed, as one medical diagnostic apparatus, which employs a "color flow mapping (CFM) method" capable of two-dimensionally displaying in color the velocity of a bloodstream in, e.g., a heart, a liver, or a carotid artery, by using a Doppler shift of ultrasonic waves caused by a bloodstream, as well as displaying tomographic images (B mode images) of human bodies. Diagnostic capability has been dramatically improved by this medical diagnostic apparatus. Medical diagnostic apparatuses using this CFM method are currently used in diagnosing all organs of a human body, such as the uterus, the liver, and the spleen, and extensive studies have been made to aim at developing an apparatus capable of diagnosing coronary thrombus.

In the case of the B mode image, it is required that high-resolution images be obtained with a high sensitivity, in order for a small change to a morbid state or a vacant space resulting from a physical change to be clearly seen to the depth. In the Doppler mode by which CFM images can be obtained, echoes reflected by fine blood cells a few micrometers in diameter are used. Therefore, signal levels obtained in this Doppler mode are small compared to those in the B mode, so it is necessary to raise the sensitivity of the Doppler mode.

The above-mentioned ultrasonic probe itself or its peripheral circuit has been variously improved in order to obtain a high sensitivity. For example, when the ultrasonic probe is used in detection for the B mode image, a piezoelectric element of an ultrasonic transmitting/receiving element has a large influence on the result obtained. The piezoelectric element for use in the ultrasonic probe must be made from a material with a large dielectric constant by which a large electromechanical coupling coefficient is attained and matching with a transmitting/receiving circuit can be obtained easily. The matching requirement is imposed in order to decrease a loss resulting from a cable or a stray capacitance. For this reason, the piezoelectric elements are formed primarily from a lead zirconate titanate (PZT) piezoelectric ceramic.

The main stream of ultrasonic probes is an array-type ultrasonic probe in which a few tens to about 200 ultrasonic transmitting/receiving elements each having a strip piezoelectric element are arranged. The number of ultrasonic transmitting/receiving elements tends to increase with increasing demand for a high resolution. However, the diameter of the ultrasonic transmitting/receiving surface of the array-type ultrasonic probe cannot be made large if the probe is to be brought into contact with a living body. Consequently, the impedance of each piezoelectric element increases as the number of ultrasonic transmitting/receiving elements increases. This makes it difficult to obtain matching with a transmitting/receiving circuit.

To solve the above problem, U.S. Pat. No. 4,958,327 has disclosed the use of a piezoelectric element consisting of a material with a large dielectric constant or the use of a layered structure of piezoelectric elements. DE3729731A1, on the other hand, has disclosed the use of an impedance converter. However, the electromechanical coupling coefficient of the PZT-based ceramic described above decreases if its relative dielectric constant exceeds 3000. This introduces a problem of low sensitivity again. In the layered structure, on the other hand, although the transmission sensitivity increases in proportion to the number of stacked layers, the reception sensitivity is inversely proportional to the stacked layer number. Therefore, a field to which the piezoelectric element of this type is applicable is limited to a special application in which, for example, the piezoelectric element is smaller than an ordinary one or the cable is long. Also, the use of an impedance converter such as an emitter follower leads to an increase in size of an ultrasonic probe and to band narrowing which is brought about by the specific frequency characteristics inherent in the impedance converter.

Other well-known examples of the piezoelectric material of the piezoelectric element are a single crystal such as lithium niobate, a ceramic such as lead titanate and lead metaniobate, and a polymeric material such as polyvinylidene fluoride or its copolymer. However, piezoelectric elements consisting of these materials are impractical because of their small dielectric constants and electromechanical coupling coefficients. A composite piezoelectric element, such as 1-3 type in which a columnar piezoelectric ceramic is embedded in a resin, is also known. Since, however, the dielectric constant of this piezoelectric element is also small, the element is unsuitable for an array-type ultrasonic probe in which a plurality of strip piezoelectric elements are arranged.

Kuwata et al. have reported in "Japan J. Appl. Phys. 21 (1982)" that a rod piezoelectric element consisting of a solid-solution single crystal of lead zinc niobate and lead titanate, among other piezoelectric materials, has an unusually large electromechanical coupling coefficient $K_{33}$ of 92%. However, this report describes only some dielectric characteristics, so the acoustic impedance, the dielectric loss, and the mechanical quality coefficient of the crystal, all of which are necessary in designing an ultrasonic probe, are still unknown. In particular, the report does not at all refer to the characteristics of strip ultrasonic transmitting/receiving elements which are widely used in ultrasonic probes. Moreover, some ultrasonic probes including a plurality of ultrasonic transmitting/receiving elements each having a strip piezoelectric element manufactured by slicing from the solid-solution single crystal cannot provide high-resolution images because their signal levels are low. The present inventors examined ultrasonic transmitting/receiving elements which were incorporated into ultrasonic probes with a low sensitivity and had these strip piezoelectric elements. Consequently, the present inventors found that the value of the apparent electromechanical coupling coefficient decreased from its initial value, and this was the cause of the low sensitivity. This decrease in the apparent electromechanical coupling coefficient can be improved by performing polarization by applying a high electric field again, and this increases the sensitivity of an ultrasonic probe. However, re-polarization in the manufacture is unpreferred since it increases the number of manufacturing steps to result in cumbersome operations. This also leads to a high cost or of degradation of performance resulting from changes with time.

SUMMARY OF THE INVENTION

It is an object of the present invention to provide a piezoelectric single crystal which has a large electromechanical coupling coefficient ($k_{33}'$), which does not bring about depolarization when processed into strip piezoelectric elements or during the manufacture of an ultrasonic probe, and which can prevent degradation in performance resulting from changes with time even after being used for long periods of time.

It is another object of the present invention to provide an ultrasonic probe which has a piezoelectric element with a small width and a large electromechanical coupling coefficient ($k_{33}'$), by which matching with a transmitting/receiving circuit can be obtained easily, and which can have a high sensitivity.

According to the present invention, there is provided a piezoelectric single crystal consisting essentially of a general formula:

$$Pb\{[M1_{1/3}Nb_{(2/3)-(2z/3)}Ta_{2z/3}]_{1-x-y}Ti_xM2_y\}O_3$$

wherein M1 represents at least one metal selected from the group consisting of Zn, Ni, and Mg, M2 represents at least one metal selected from the group consisting of Pt, Fe, Bi, Rh, and Ir, and x, y, and z are defined as $0.05 \leq x$ 21 0.2, $0.00001 \leq y \leq 0.01$, and $0 \leq z \leq 0.1$, respectively.

According to the present invention, there is provided a piezoelectric single crystal consisting essentially of a general formula:

$$Pb\{[M3_{1/2}Nb_{(1/2)-(z/2)}Ta_{z/2}]_{1-x-y}Ti_xM2_y\}O_3$$

wherein M2 represents at least one metal selected from the group consisting of Pt, Fe, Bi, Rh, and Ir, M3 represents at least one metal selected from the group consisting of Sc and In, and x, y, and z are defined as $0.2 \leq x \leq 0.6$, $0.00001 \leq y \leq 0.01$, and $0 \leq z \leq 0.1$, respectively.

According to the present invention, there is provided an ultrasonic probe comprising:
- a piezoelectric element having an ultrasonic transmitting/receiving surface; and
- a pair of electrodes formed on the ultrasonic transmitting/receiving surface of the piezoelectric element and a surface opposite to the ultrasonic transmitting/receiving surface, respectively, and
- wherein the piezoelectric element is made of a single crystal consisting essentially of a general formula:

$$Pb\{[M1_{1/3}Nb_{(2/3)-(2z/3)}Ta_{2z/3}]_{1-x-y}Ti_xM2_y\}O_3$$

wherein M1 represents at least one metal selected from the group consisting of Zn, Ni, and Mg, M2 represents at least one metal selected from the group consisting of Pt, Fe, Bi, Rh, and Ir, and x, y, and z are defined as $0.05 \leq x \leq 0.2$, $0.00001 \leq y \leq 0.01$, and $0 \leq z \leq 0.1$, respectively.

According to the present invention, there is provided an ultrasonic probe comprising:
- a piezoelectric element having an ultrasonic transmitting/receiving surface; and
- a pair of electrodes formed on the ultrasonic transmitting/receiving surface of the piezoelectric element and a surface opposite to the ultrasonic transmitting/receiving surface, respectively, and
- wherein the piezoelectric element is made of a single crystal consisting essentially of a general formula:

$$Pb\{[M3_{1/2}Nb_{(1/2)-(z/2)}Ta_{z/2}]_{1-x-y}Ti_xM2_y\}O_3$$

wherein M2 represents at least one metal selected from the group consisting of pt, Fe, Bi, Rh, and Ir, M3 represents at least one metal selected from the group consisting of Sc and In, and x, y, and z are defined as $0.2 \leq x \leq 0.6$, $0.00001 \leq y \leq 0.01$, and $0 \leq z \leq 0.1$, respectively.

According to the present invention, there is provided an array-type ultrasonic probe comprising:
- a plurality of piezoelectric elements aligned and each having an ultrasonic transmitting/receiving surface; and
- a pair of electrodes formed on the ultrasonic transmitting/receiving surface of each piezoelectric element and a surface opposite to the ultrasonic transmitting/receiving surface, respectively, and
- wherein the piezoelectric element is made of a single crystal consisting essentially of a general formula:

$$Pb\{[M1_{1/3}Nb_{(2/3)-(2z/3)}Ta_{2z/3}]_{1-x-y}Ti_xM2_y\}O_3$$

wherein M1 represents at least one metal selected from the group consisting of Zn, Ni, and Mg, M2 represents at least one metal selected from the group consisting of Pt, Fe, Bi, Rh, and Ir, and x, y, and z are defined as $0.05 \leq x \leq 0.2$, $0.00001 \leq y \leq 0.01$, and $0 \leq z \leq 0.1$, respectively.

According to the present invention, there is provided an array-type ultrasonic probe comprising:
- a plurality of piezoelectric elements aligned and each having an ultrasonic transmitting/receiving surface; and
- a pair of electrodes formed on the ultrasonic transmitting/receiving surface of each piezoelectric element and a surface opposite to the ultrasonic transmitting/receiving surface, respectively, and
- wherein the piezoelectric element is made of a single crystal consisting essentially of a general formula:

$$Pb\{[M3_{1/2}Nb_{(1/2)-(z/2)}Ta_{z/2}]_{1-x-y}Ti_xM2_y\}O_3$$

wherein M2 represents at least one metal selected from the group consisting of Pt, Fe, Bi, Rh, and Ir, M3 represents at least one metal selected from the group consisting of Sc and In, and x, y, and z are defined as $0.2 \leq x \leq 0.6$, $0.00001 \leq y \leq 0.01$, and $0 \leq z \leq 0.1$, respectively.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
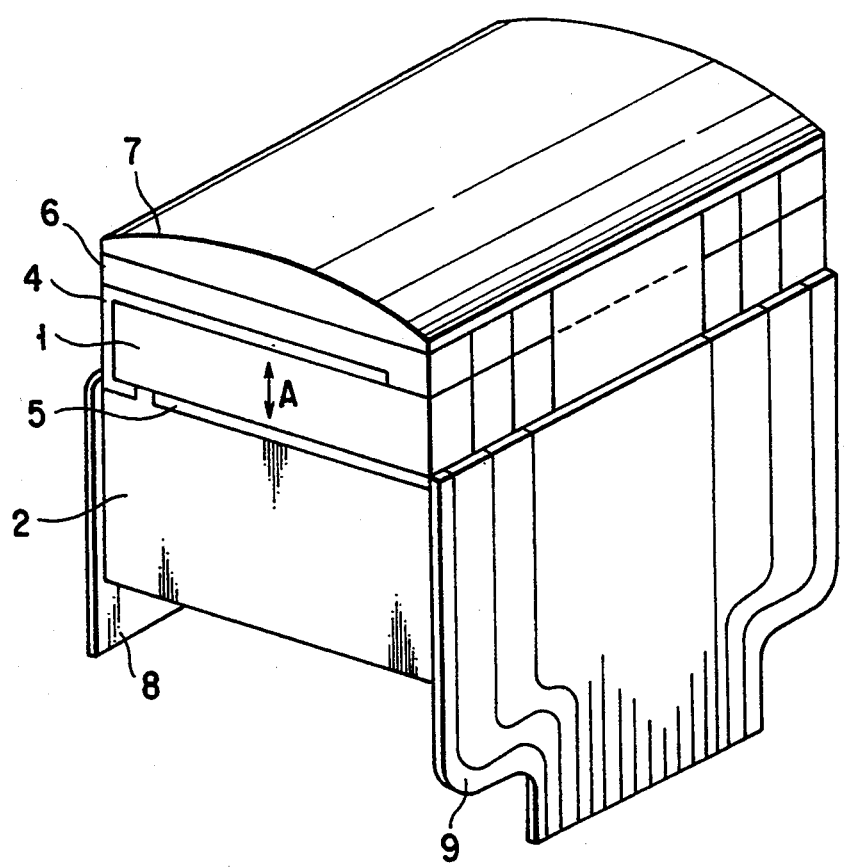
FIG. 1 is a perspective view showing an ultrasonic probe according to the present invention.

A piezoelectric single crystal according to the present invention consists essentially of Formula (I):

$$Pb\{M1_{1/3}Nb_{(2/3)-(2z/3)}Ta_{2z/3}]_{1-x-y}Ti_xM2_y\}O_3 \quad (I)$$

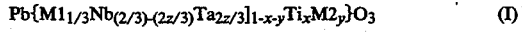

wherein M1 represents at least one metal selected from the group consisting of Zn, Ni, and Mg, M2 represents at least one metal selected from the group consisting of Pt, Fe, Bi, Rh, and Ir, and x, y, and z are defined as $0.05 \leq x \leq 0.2$, $0.00001 \leq y \leq 0.01$, and $0 \leq z \leq 0.1$, respectively.

More specifically, there is provided a piezoelectric single crystal consisting essentially of Formula (I-1):

$$Pb\{[M1_{1/3}Nb_{2/3}]_{1-x-y}Ti_xM2_y\}O_3 \quad (I-1)$$

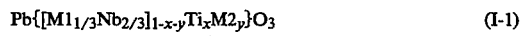

wherein M1 and M2 represent metals identical with those of Formula (I), and x and y are defined as $0.05 \leq x \leq 0.2$ and $0.00001 \leq y \leq 0.01$, respectively.

There is also provided a piezoelectric single crystal consisting essentially of Formula (I-2):

$$Pb\{[M1_{1/3}Nb_{(2/3)-(2z/3)}Ta_{2z/3}]_{1-x-y}Ti_xM2_y\}O_3 \quad (I-2)$$

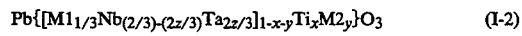

wherein M1 and M2 represent metals identical with those of Formula (I), and x, y, and z are defined as $0.05 \leq x \leq 0.2$, $0.00001 \leq y \leq 0.01$, and $0 \leq z \leq 0.1$, respectively.

M1 in Formulas (I-1) and (I-2) is most preferably Zn. In Formulas (I-1) and (I-2), x is defined for the reason explained below. If x is smaller than 0.05, the Curie temperature of the above solid-solution single crystal decreases. Also, depolarization occurs when the single crystal is cut or due to the influence of heat. On the other hand, if x is greater than 0.2, not only no large electromechanical coupling coefficient $k_{33}'$ can be obtained, but also the dielectric constant decreases. The value of x is more preferably 0.06 to 0.13.

M2 in Formulas (I-1) and (I-2) is most preferably Pt. In Formulas (I-1) and (I-2), y is defined for the reason explained below. If y is smaller than 0.00001, it becomes impossible to discourage depolarization of a vibrator having a piezoelectric element consisting of the above solid-solution single crystal. If y is greater than 0.01, the electromechanical coupling coefficient $k_{33}'$ of the piezoelectric single crystal becomes small compared to that of the conventional PZT-based piezoelectric ceramic, or it becomes difficult to manufacture a piezoelectric single crystal having a perovskite structure with good piezoelectric characteristics. The value of y is more preferably 0.00001 to 0.001.

Ta in Formula (I-2) has an effect of discouraging depolarization of a vibrator having a piezoelectric element consisting of the above solid-solution single crystal. If z in Formula (I-2) exceeds 0.1, the electromechanical coupling coefficient $k_{33}'$ of the piezoelectric single crystal becomes small compared to that of the conventional PZT-based piezoelectric ceramic, or it becomes difficult to manufacture a piezoelectric single crystal having a perovskite structure with good piezoelectric characteristics. The value of z is more preferably 0.001 to 0.05.

A piezoelectric single crystal represented by Formula (I-1) or (I-2) is manufactured by, e.g., a flux method, a Bridgeman method, a Kyropoulos method, or a hydrothermal growth method.

The piezoelectric single crystal according to the present invention discussed above has a composition in which, as represented by Formula (I), Ti of a solid-solution single crystal of lead zinc niobate-lead titanate represented by $Pb[M1_{1/3}Nb_{2/3}]_{1-x}Ti_x]O_3$ (M1 is, e.g., Zn) is slightly substituted with the metal M2 which is at least one metal selected from Pt, Fe, Bi, Rh, and Ir. Therefore, it is possible to suppress depolarization of an ultrasonic transmitting/receiving element occurring when the ultrasonic transmitting/receiving element consisting of a piezoelectric element having a pair of electrodes is manufactured by processing a single crystal on both the surfaces of which conductor layers are formed, or due to heat produced during a bonding step in the manufacture of an ultrasonic probe, without degrading the piezoelectric characteristics. In particular, depolarization of an ultrasonic transmitting/receiving element can be further suppressed by the use of a piezoelectric single crystal with a composition in which, as represented by Formula (I-2), Ti of a solid-solution single crystal of lead zinc niobate-lead titanate is slightly substituted with M2 and at the same time Nb of the solid-solution single crystal is slightly substituted with Ta. In addition, a piezoelectric single crystal represented by Formula (I) has good piezoelectric characteristics in which the electromechanical coupling coefficient $k_{33}'$ is 82 to 83%.

Another piezoelectric single crystal according to the present invention consists essentially of Formula (II):

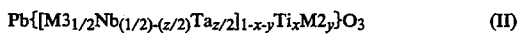   (II)

wherein M2 represents at least one metal selected from the group consisting of Pt, Fe, Bi, Rh, and Ir, M3 represents at least one metal selected from the group consisting of Sc and In, and x, y, and z are defined as $0.2 \leq x \leq 0.6$, $0.00001 \leq y \leq 0.01$, and $0 \leq z \leq 0.1$, respectively.

More specifically, there is provided a piezoelectric single crystal consisting essentially of Formula (II-1):

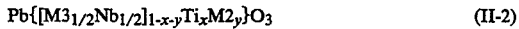   (II-2)

wherein M2 and M3 represent metals identical with those of Formula (II), and x and y are defined as $0.2 \leq x \leq 0.6$ and $0.00001 \leq y \leq 0.01$, respectively.

There is also provided a piezoelectric single crystal consisting essentially of Formula (II-2):

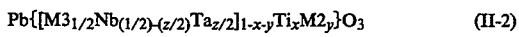   (II-2)

wherein M2 and M3 represent metals identical with those of Formula (I), and x, y, and z are defined as $0.2 \leq x \leq 0.6$, $0.00001 \leq y \leq 0.01$, and $0 \leq z \leq 0.1$, respectively.

M3 in Formulas (II-1) and (II-2) is most preferably Sc. In Formulas (II-1) and (II-2), x is defined for the reason explained below. If x is smaller than 0.2, the Curie temperature of the above solid-solution single crystal decreases. Also, depolarization occurs when the single crystal is cut or due to the influence of heat. On the other hand, if x is greater than 0.6, not only no large electromechanical coupling coefficient $k_{33}'$ can be obtained, but also the dielectric constant decreases. The value of x is more preferably 0.2 to 0.5.

M2 in Formulas (II-1) and (II-2) is most preferably Pt. In Formulas (II-1) and (II-2), y is defined for the reason explained below. If y is smaller than 0.00001, it becomes impossible to discourage depolarization of a vibrator having a piezoelectric element consisting of the above solid-solution single crystal. If y is greater than 0.01, the electromechanical coupling coefficient $k_{33}'$ of the piezoelectric single crystal becomes small compared to that of the conventional PZT-based piezoelectric ceramic, or it becomes difficult to manufacture a piezoelectric single crystal having a perovskite structure with good piezoelectric characteristics. The value of y is more preferably 0.00001 to 0.001.

Ta in Formula (II-2) has an effect of discouraging depolarization of a vibrator having a piezoelectric element consisting of the above solid-solution single crystal. If z in Formula (II-2) exceeds 0.1, the electromechanical coupling coefficient $k_{33}'$ of the piezoelectric single crystal becomes small compared to that of the conventional PZT-based piezoelectric ceramic, or it becomes difficult to manufacture a piezoelectric single crystal having a perovskite structure with good piezoelectric characteristics. The value of z is more preferably 0.001 to 0.05.

A piezoelectric single crystal represented by Formula (II-1) or (II-2) is manufactured by, e.g., a flux method, a Bridgeman method, a Kyropoulos' method, or a hydrothermal growth method.

Another piezoelectric single crystal according to the present invention discussed above has a composition in which, as represented by Formula (II), Ti of a solid-solution single crystal of lead scandium niobate-lead titanate represented by $Pb\{[M3_{1/2}Nb_{1/2}]_{1-x}Ti_x\}O_3$ (M3 is, e.g., Sc) is slightly substituted with the metal M2 which is at least one metal selected from Pt, Fe, Bi, Rh, and Ir. Therefore, it is possible to suppress depolarization of an ultrasonic transmitting/receiving element occurring when the ultrasonic transmitting/receiving element consisting of a piezoelectric element having a pair of electrodes is manufactured by processing a single crystal on both the surfaces of which conductor layers are formed, or due to heat produced during a bonding step in the manufacture of an ultrasonic probe, without degrading the piezoelectric characteristics. In particular, depolarization of an ultrasonic transmitting/receiving element can be further suppressed by the use of a piezoelectric single crystal with a composition in which, as represented by Formula (II-2), Ti of a solid-solution single crystal of lead scandium niobate-lead titanate is slightly substituted with M2 and at the same time Nb of the solid-solution single crystal is slightly substituted with Ta. In addition, a piezoelectric single crystal represented by Formula (II) has good piezoelectric characteristics in which the electromechanical coupling coefficient $k_{33}'$ is 82 to 83%.

An array-type ultrasonic probe according to the present invention is described in detail below with reference to FIGS. 1 and 2.

A plurality of piezoelectric elements 1 consisting of a piezoelectric single crystal are separately bonded on a backing material 2. As shown in FIG. 2, each piezoelectric element 1 assumes a strip shape and has a surface with the second largest area as an ultrasonic transmitting/receiving surface 3. The piezoelectric element 1 vibrates in the direction indicated by an arrow A in FIG. 1. A first electrode 4 is so formed as to cover the ultrasonic transmitting/receiving surface 3, one side surface, and a portion of the surface opposite to the transmitting/receiving surface 3, of each piezoelectric element 1. A second electrode 5 is formed on the surface opposite to the ultrasonic transmitting/receiving surface 3 of each piezoelectric element 1 so as to be spaced apart from the first electrode 4 with a desired distance between them. These piezoelectric element 1 and first and second electrodes 4 and 5 constitute an ultrasonic transmitting/receiving element. An acoustic matching layer 6 is formed on the ultrasonic transmitting/receiving surface 3, including the first electrode 4, of each piezoelectric element 1. An acoustic lens 7 is formed across all of the acoustic matching layers 6. A ground electrode plate 8 is connected to each first electrode 4. A flexible printed wiring board 9 is connected to the second electrodes 5 by, e.g., soldering. A plurality of conductors (cables) (not shown) are connected to the flexible printed wiring board 9.

The piezoelectric element 1 is made of a single crystal consisting essentially of Formula (I):

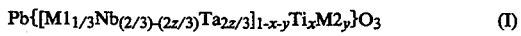
$$Pb\{[M1_{1/3}Nb_{(2/3)-(2z/3)}Ta_{2z/3}]_{1-x-y}Ti_xM2_y\}O_3 \quad (I)$$

wherein M1 represents at least one metal selected from the group consisting of Zn, Ni, and Mg, M2 represents at least one metal selected from the group consisting of Pt, Fe, Bi, Rh, and Ir, and x, y, and z are defined as $0.05 \leq x \leq 0.2$, $0.00001 \leq y \leq 0.01$, and $0 \leq z \leq 0.1$, respectively, or a single crystal consisting essentially of Formula (II):

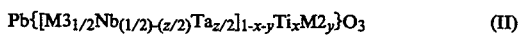
$$Pb\{[M3_{1/2}Nb_{(1/2)-(z/2)}Ta_{z/2}]_{1-x-y}Ti_xM2_y\}O_3 \quad (II)$$

wherein M2 represents at least one metal selected from the group consisting of Pt, Fe, Bi, Rh, and Ir, M3 represents at least one metal selected from the group consisting of Sc and In, and x, y, and z are defined as $0.2 \leq x \leq 0.6$, $0.00001 \leq y \leq 0.01$, and $0 \leq z \leq 0.1$, respectively.

In the piezoelectric element 1 made of a single crystal represented by Formula (I) or (II), it is preferable that the solid-solution quantity of lead titanate be smallest in a central portion of the ultrasonic transmitting/receiving surface 3 and increase gradually toward both the end portions of the surface. Such a piezoelectric element changes its piezoelectric characteristics, particularly the electromechanical coupling coefficient with changes in the solid-solution quantity of lead titanate. Therefore, an ultrasonic beam whose side lobe is reduced can be emitted by minimizing the molar fraction of lead titanate in the central portion of the piezoelectric element 1, in a direction perpendicular to the direction of the array of the piezoelectric elements 1 in the array-type ultrasonic probe discussed above, so that the electromechanical coupling coefficient reaches a maximum at that portion, and by gradually increasing the molar fraction of lead titanate toward both the ends so as to decrease the electromechanical coupling coefficient.

The thickness of the piezoelectric element 1 in the vibration direction is preferably 200 to 400 μm.

The first and second electrodes 4 and 5 consist of a two-layered conductive film, such as a Ti/Au, Ni/Au, or Cr/Au film, or a three-layered conductive film of Ti/Ni/Au, formed by a vapor deposition method. Alternatively, the first and second electrodes 4 and 5 are formed by baking silver containing glass frits.

Figure 2:
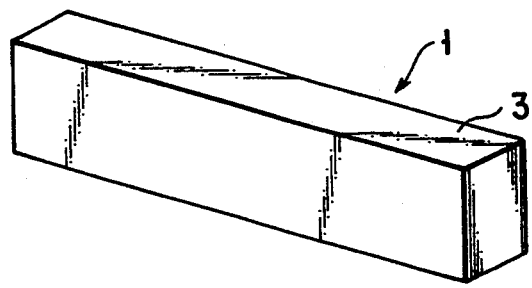
FIG. 2 is a perspective view showing a strip piezoelectric element to be incorporated into the ultrasonic probe in FIG. 1.

Note that the arrangement of the electrodes 4 and 5 and the method by which the ground electrode plates 8 and the flexible printed wiring board 9 are connected to the electrodes 4 and 5 are not limited to those illustrated in FIG. 1. As an example, the method of connecting the ground electrode plates 8 and the flexible printed wiring board 9 to the electrodes 4 and 5 is not limited to soldering but may be use of a conductive paste or resistance welding.

Also, the arrangement of the electrodes is not limited to the one in which the electrodes are formed on the entire ultrasonic transmitting/receiving surface and on the entire surface opposite to the transmitting/receiving surface of each piezoelectric element. For example, a pair of electrodes may be formed on the ultrasonic transmitting/receiving surface and the surface away from the transmitting/receiving surface of each piezoelectric element such that the two electrodes are shifted from each other on their respective surfaces and at the same time oppose each other in desired regions of these surfaces.

The ultrasonic probe with the structure shown in FIG. 1 is manufactured by, e.g., the following method. This method is described below with reference to FIGS. 3A and 3B.

Figure 3A:
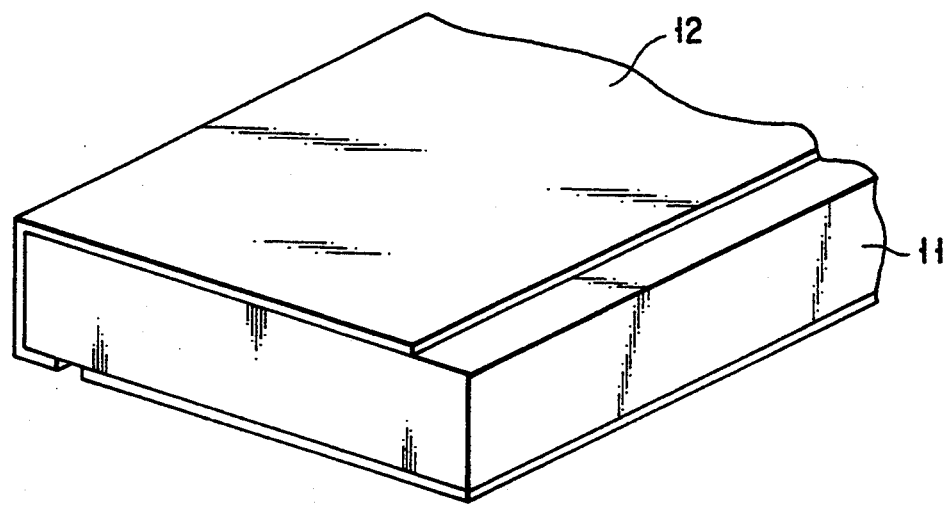
FIGS. 3A and 3B are perspective views showing the steps of manufacturing the ultrasonic probe in FIG. 1.

To begin with, as shown in FIG. 3A, a conductive film is vapor-deposited by sputtering on a rectangular single-crystal piece 11 cut out from a single crystal represented by Formula (I) or (II), and is left behind as a conductive film 12 on the ultrasonic transmitting/receiving surface and the surface opposite to the transmitting/receiving surface by selective etching. Subsequently, as in FIG. 3B, an acoustic matching material layer 13 is formed on the surface, serving as the ultrasonic transmitting/receiving surface, of the single-crystal piece 11. Thereafter, ground electrode plates (not shown) are connected by soldering or by using a conductive paste to the conductive film 12 mostly located on the ultrasonic transmitting/receiving surface of the single-crystal piece 11. Likewise, a flexible printed wiring board (not shown) is connected by soldering or by using a conductive paste to the conductive film 12 mostly located on the surface opposite to the ultrasonic transmitting/receiving surface of the single-crystal piece 11. Subsequently, the resultant structure is bonded on the backing material 2, and a portion from the acoustic matching material layer 13 to the single-crystal piece 11 is sliced a plurality of number of times in a direction indicated by the alternate long and short dashed lines in FIG. 3B by using a blade. By this slicing step, separate piezoelectric elements 1 each having the first and second electrodes 4 and 5, and the acoustic matching layers 6 arranged on the individual piezoelectric elements 1, are formed on the backing material 2, as in FIG. 1. Note that the ground electrode plates 8 are connected to the first electrodes 4 by soldering or by using a conductive paste, and the flexible printed wiring board 9 is connected to the second electrodes 5 by soldering or by using a conductive paste.

Subsequently, the acoustic lens 7 is bonded on the acoustic matching layers 6, and a plurality of conductors (cables) (not shown) are connected to the flexible printed wiring board 9. In this manner, an ultrasonic probe is manufactured.

In the process of manufacturing the ultrasonic probe described above, it is preferable that chamfered portions 14 (FIG. 4) be formed on the rectangular single-crystal piece 11 by chamfering the edges extending in a direction perpendicular to the slice direction. This "chamfering" means planar chamfering or chamfering by which an R of a circular arc is formed. The degree of this chamfering is preferably 1/20 to ⅓ the thickness of the single-crystal piece 11. The degree of chamfering for the edges of the single crystal is limited within the above range because, if the degree falls outside the range, formation of cracks in the slicing step cannot be suppressed effectively. The degree of chamfering for the edges of the single crystal is more preferably 1/16 to ¼ the thickness of the single crystal.

Figure 3B:
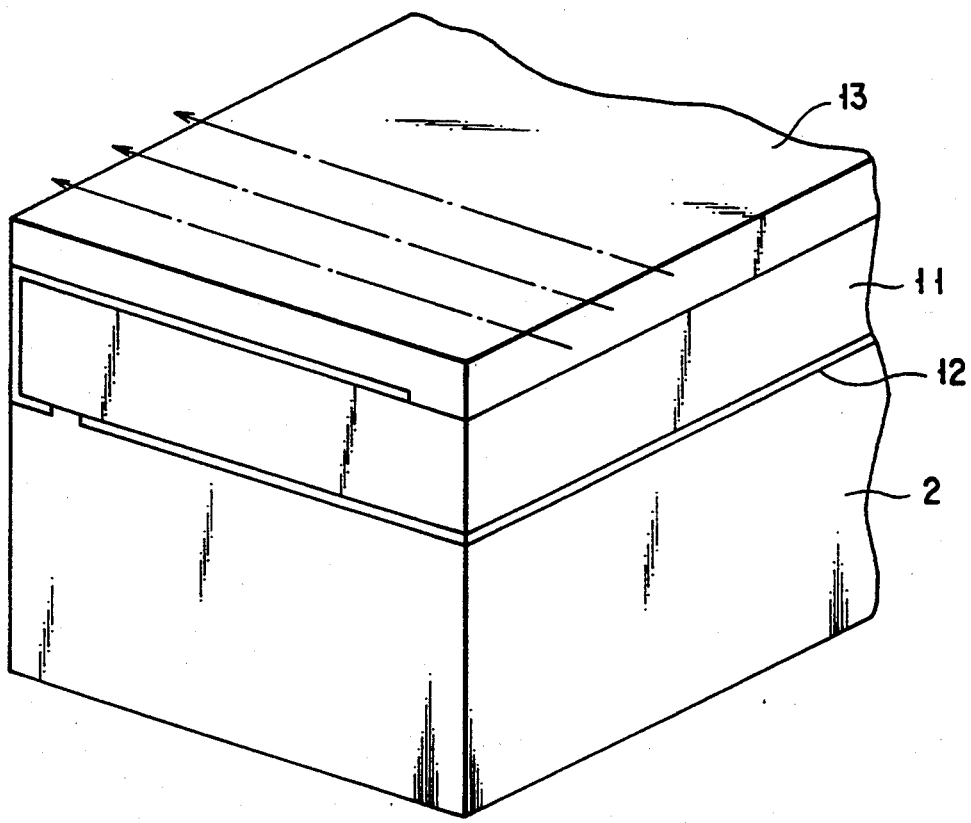

When slicing is performed with a blade, as in FIGS. 3A and 3B, by using the rectangular single-crystal piece 11 whose edges are chamfered to the above predetermined degree, it is possible to avoid concentration of the mechanical stress of the blade on portions corresponding to the edges of the rectangular single-crystal piece 11. Consequently, formation of cracks in the piezoelectric elements after the slicing can be prevented. This permits a high-yield manufacture of an array-type ultrasonic probe which includes a plurality of ultrasonic transmitting/receiving elements each having a piezoelectric element free from cracks and having a stable electromechanical coupling coefficient.

Figure 5:
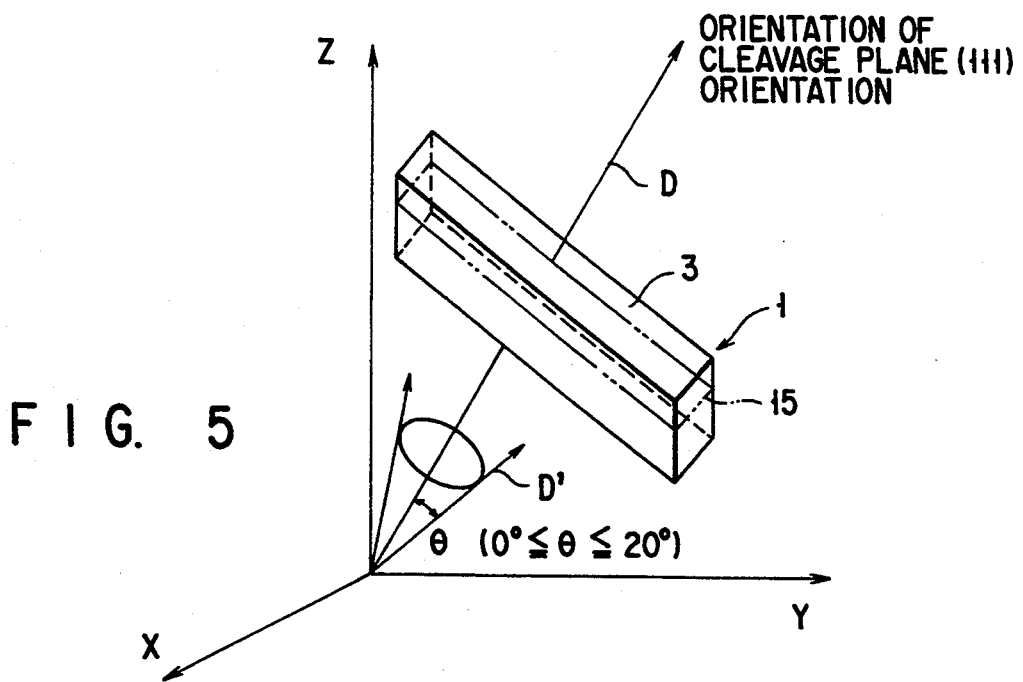
FIG. 5 is a perspective view showing a strip piezoelectric element which consists of a single crystal having a cleavage plane and is cut out such that its ultrasonic transmitting/receiving surface is parallel to the cleavage plane.

If a single crystal represented by Formula (I) or (II) has a cleavage plane, it is preferable that the ultrasonic transmitting/receiving surface of the piezoelectric element be parallel to the cleavage plane or form an angle of 20° or smaller with the cleavage plane. In this case, "the ultrasonic transmitting/receiving surface of the piezoelectric element is parallel to the cleavage plane or forms an angle of 20° or smaller with the cleavage plane" means all instances in which, as in FIG. 5, an angle $\theta$ defined between a normal D' to the ultrasonic transmitting/receiving surface 3 of the piezoelectric element 1 and a normal D to a cleavage plane 15 of the single crystal is 20° or smaller. In the manufacture of the ultrasonic probe discussed above, therefore, the strip piezoelectric element 1 is preferably cut out from the rectangular single-crystal piece such that the ultrasonic transmitting/receiving surface 3 is parallel to the cleavage plane 15, as in FIG. 6.

As described above, in the formation of strip piezoelectric elements performed by slicing a single crystal represented by Formula (I) or (II) and having a cleavage plane, each piezoelectric element is so cut that its ultrasonic transmitting/receiving surface is parallel to the cleavage plane or forms an angle of 20° or smaller with the cleavage plane. Consequently, it is possible to prevent formation of cracks resulting from the cleavage plane and to prevent occurrence of failures of an ultrasonic transmitting/receiving element incorporating the piezoelectric element when in use. This allows a high-yield manufacture of a highly reliable ultrasonic probe including a plurality of ultrasonic transmitting/receiving elements.

The ultrasonic probe according to the present invention includes ultrasonic transmitting/receiving elements each having a piezoelectric element which is made of a single crystal consisting essentially of Formula (I) or (II), has a large electromechanical coupling coefficient, and discourages depolarization caused by the effect of heat. Therefore, it is possible to realize an ultrasonic probe with a higher sensitivity and a higher reliability than those of an ultrasonic probe having piezoelectric elements made of a PZT-based piezoelectric ceramic.

Figure 7:
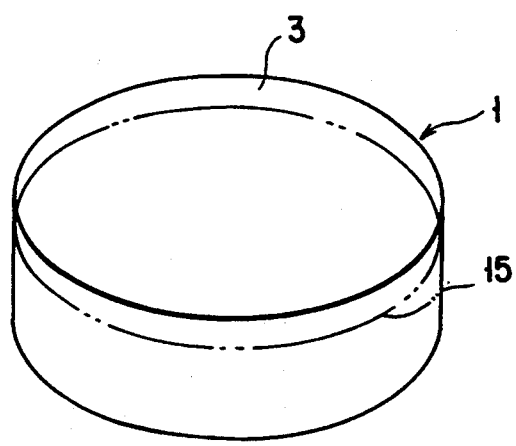
FIG. 7 is a perspective view showing a disk-like piezoelectric element which consists of a single crystal having a cleavage plane and is cut out such that its ultrasonic transmitting/receiving surface is parallel to the cleavage plane.

Note that the array-type ultrasonic probe is illustrated in FIG. 1, but the present invention is also directed to an ultrasonic probe including a single ultrasonic transmitting/receiving element having a rectangular or columnar piezoelectric element. In the manufacture of an ultrasonic probe of this sort, if a single crystal represented by Formula (I) or (II) has a cleavage plane, a columnar piezoelectric element 1 is preferably so cut that its ultrasonic transmitting/receiving surface 3 is parallel to a cleavage plane 15, as in FIG. 7. Alternatively, the columnar piezoelectric element is preferably cut such that its ultrasonic transmitting/receiving surface forms an angle of 20° or smaller with the cleavage plane.

Another ultrasonic probe according to the present invention includes an ultrasonic transmitting/receiving element having a piezoelectric element which is made of a single crystal, and in which an electromechanical coupling coefficient $k_{33}'$, a relative dielectric constant $\epsilon_r (=\epsilon_{33}^T/\epsilon_0)$, and a Curie point Tc meet Expression (1) below:

$$5 \leq (k_{33}'^4 \times \epsilon_r)/Tc \leq 20 \qquad (1)$$

An ultrasonic probe having a piezoelectric element whose $(k_{33}'^4 \times \epsilon_r)/Tc$ in Expression (1) is smaller than 5 cannot achieve high sensitivities. On the other hand, a piezoelectric element whose $(k_{33}'^4 \times \epsilon_r)/Tc$ in Expression (1) is greater than 20 has a low Curie point. Therefore, depolarization readily takes place if array cutting is performed to obtain an ultrasonic probe having this piezoelectric element. Additionally, a piezoelectric element of this type exhibits the characteristics of a capacitor (electrostrictive) material, i.e., has a Curie point near room temperature, and is therefore unsuitable as an ultrasonic probe. Therefore, any piezoelectric material meeting the above condition can be applied to the piezoelectric element. Practical examples of the piezoelectric material are a solid-solution single crystal of lead zinc niobate-lead titanate, and a solid-solution single crystal consisting essentially of Formula (I) or (II).

High sensitivities can be achieved by an ultrasonic probe including an ultrasonic transmitting/receiving element having a piezoelectric element meeting the condition of Expression (1), particularly an array-type ultrasonic probe in which a plurality of these strip ultrasonic transmitting/receiving elements are arranged.

That is, the Curie point is within the operating range of an ultrasonic probe in Expression (1), and Expression (1) represents the relationship between the electromechanical coupling coefficient, the dielectric constant, and the Curie point, all of which are important parameters for determining the sensitivity and matching of the electrical impedance. Therefore, in an ultrasonic probe having a piezoelectric element meeting Expression (1), the significant difference in sensitivity is 2 dB or more. In addition, the use of this piezoelectric element prevents a decrease in sensitivity caused by depolarization during cutting, thereby achieving a high sensitivity.

Figure 8:
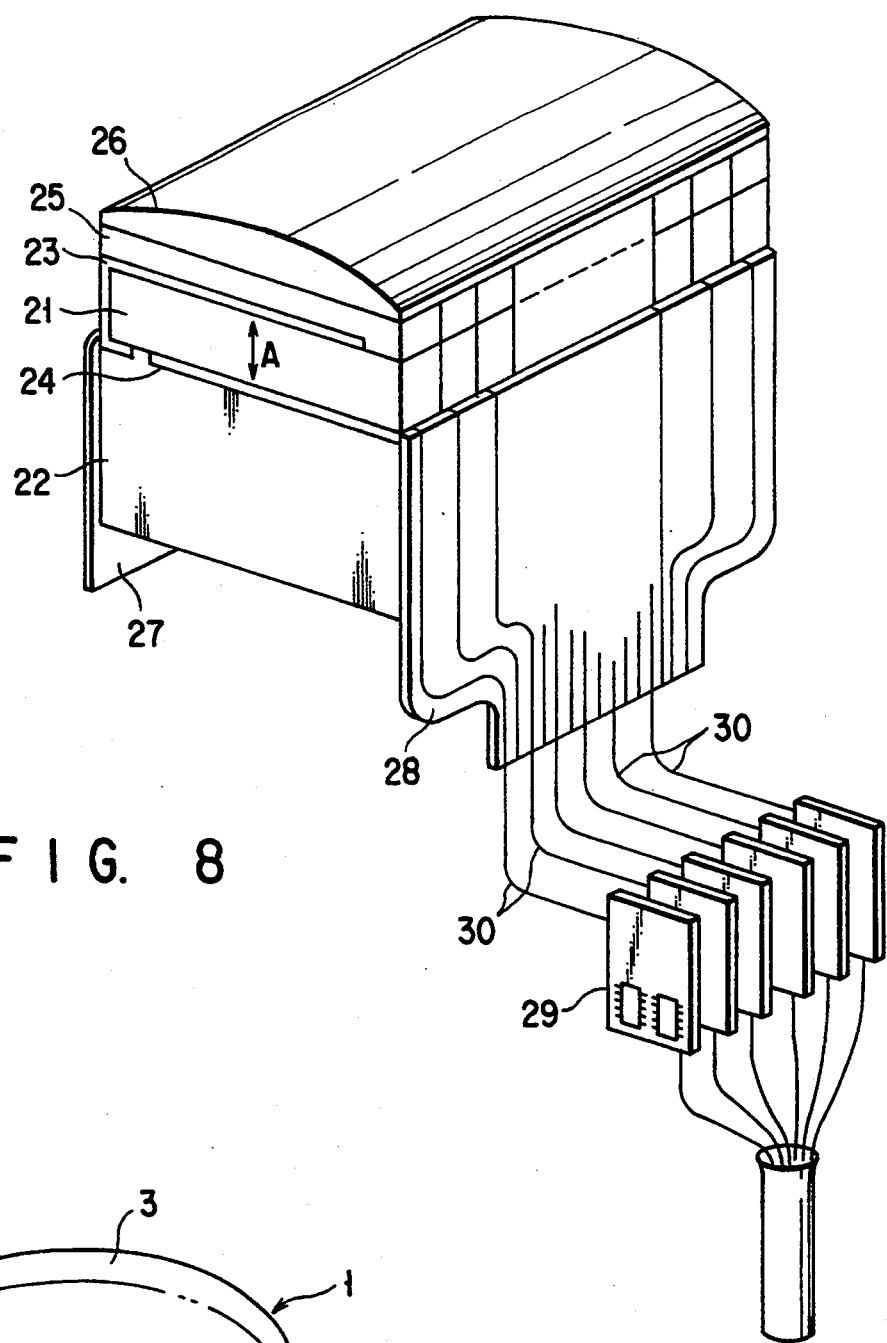
FIG. 8 is a perspective view showing another ultrasonic probe according to the present invention.

Still another ultrasonic probe according to the present invention is described in detail below with reference to FIG. 8.

A plurality of piezoelectric elements 21 are separately bonded on a backing material 22. Each piezoelectric element 21 vibrates in the direction indicated by an arrow A in FIG. 8. A first electrode 23 is so formed as to cover an ultrasonic transmitting/receiving surface, one side surface, and a portion of the surface opposite to the transmitting/receiving surface, of each piezoelectric element 21. A second electrode 24 is formed on the surface opposite to the ultrasonic transmitting/receiving surface of each piezoelectric element 21 so as to be spaced apart from the first electrode 23 with a desired distance between them. These piezoelectric element 21 and first and second electrodes 23 and 24 constitute an ultrasonic transmitting/receiving element. An acoustic matching layer 25 is formed on the ultrasonic transmitting/receiving surface, including the first electrode 23, of each piezoelectric element 21. An acoustic lens 26 is formed across all of the acoustic matching layers 25. A ground electrode plate 27 is connected to the first electrodes 23. A flexible printed wiring board 28 is connected to the second electrodes 24 by, e.g., soldering. A plurality of impedance converting circuits 29 are connected to the flexible printed wiring board 28 through the cables 30.

In the piezoelectric element 21, an electromechanical coupling coefficient $k_{33}'$ and a relative dielectric constant $\epsilon_r(=\epsilon_{33}^T/\epsilon_0)$ meet Expressions (2) and (3) below:

$$2\times 10^{-4} \leq k_{33}'^4/\epsilon_r \leq 5\times 10^{-4} \quad (2)$$

$$0.7 \leq k_{33}' \quad (3)$$

If $k_{33}'$ in Expression (3) is smaller than 0.7, no high-sensitivity ultrasonic probe can be obtained. An ultrasonic probe having a piezoelectric element whose $k_{33}'^4/\epsilon_r$ in Expression (2) is smaller than $2\times 10^{-4}$ under the conditions meeting Expression (3) cannot achieve high sensitivities. On the other hand, a piezoelectric material whose $k_{33}'^4/\epsilon_r$ in Expression (2) is greater than $5\times 10^{-4}$ under the same conditions can be regarded as a material with a small dielectric constant. That is because a material with a small dielectric constant can be developed more easily than a material with a large coupling coefficient. If the drive voltage for an ultrasonic probe is increased in order to obtain an equal transmission power in such a dielectric body, the reception sound pressure also increases. However, since a high-voltage switch is commonly used as an array-probe driving circuit, the drive voltage cannot be raised because of the limit of the withstand voltage. Therefore, any piezoelectric material meeting the above conditions can be applied to the piezoelectric element 21. Practical examples of the piezoelectric material are a solid-solution single crystal of lead zinc niobate-lead titanate, and a solid-solution single crystal consisting essentially of Formula (I) or (II).

Still another ultrasonic probe according to the present invention discussed above includes impedance converting circuits, such as emitter followers, for reducing a voltage loss resulting from the stray capacitance of the cables or of the apparatus, and ultrasonic transmitting-/receiving elements each having a piezoelectric element meeting the conditions of Expressions (2) and (3). Therefore, it is possible to further increase the sensitivity and sufficiently raise the input power.

That is, Expression (2) represents the relationship between the electromechanical coupling coefficient $k_{33}'$ and the relative dielectric constant $\epsilon_r(=\epsilon_{33}^T/\epsilon_0)$ of the piezoelectric element, and Expression (3) defines the lower limit of $k_{33}'$. An ultrasonic transmitting/receiving element having a dielectric element meeting Expressions (2) and (3) has good matching with an impedance converting circuit having the above function. Consequently, an ultrasonic probe further improved in sensitivity can be realized. In addition, by setting the upper limit of $k_{33}'^4/\epsilon_r$ in Expression (2) to $5\times 10^{-4}$, it is also possible to sufficiently increase the input power since the drive voltage can be increased.

The present invention will be described in more detail below by way of its preferred examples.

EXAMPLE 1

Chemically high-purity PbO, ZnO, $Nb_2O_5$, $TiO_2$, and PtO were used as starting materials. These materials were corrected in purity and weighed to yield a composition in which the molar ratio of lead zinc niobate (PZN) to lead titanate (PT) was 91:9 and Ti contained in the PT was partially substituted with Pt. In addition, an equal quantity of PbO was added as a flux. The resultant powder was added with pure water and mixed in a ball mill containing $ZrO_2$ balls for one hour. After water was removed from the resultant mixture, the mixture was ground sufficiently by a grinder, placed in a rubber mold, and rubber-pressed at a pressure of 2 tons/cm². A 600 g portion of the solid matter extracted from the rubber mold was placed in a platinum vessel 50 mm in diameter and 250 cc in volume and melted by heating to a temperature of 900° C. over four hours. After cooling, another 400 g portion of the above solid matter was placed in the vessel, and the vessel was sealed with a platinum cover and placed at the center of an electric oven. The platinum vessel was heated to a temperature of 1260° C. over five hours, gradually cooled to 800° C. at a rate of 0.8° C./hr, and then cooled to room temperature. Thereafter, 30% nitric acid was added to the platinum vessel and boiled for eight hours, and the resultant solid-solution single crystal was extracted. The obtained single crystal assumed an arrowhead shape about 20 mm square. A portion of the single crystal was ground and subjected to X-ray diffraction to examine its crystal structure. Consequently, the single crystal was found to have a perovskite structure. The powder was then chemically analyzed with ICP and found to have the composition $Pb[(M1_{1/3}Nb_{2/3})_{1-x-y}Ti_xM2_y)]O_3$ (M1; Zn, M2; Pt, x; 0.09, y; 0.0001). Thereafter, the orientation of the [001] axis of the single crystal was determined by using a Laue camera, and the single crystal was cut in a direction perpendicular to that axis.

Subsequently, the cut surface of the single crystal was abraded with an abrasive of #2000 to form a 500 μm thick single-crystal plate, and Ni/Au electrodes were formed on the (001) abraded surface by sputtering. The single-crystal plate having these electrodes was dipped in silicone oil, heated to 200° C., and then cooled to 40° C. while an electric field of 1 kV/mm was applied. Thereafter, the single-crystal plate with the electrodes was cut into 250 μm wide strips by using a dicing saw. The capacitance, the resonant frequency, and the anti-resonant frequency of each strip ultrasonic transmitting-/receiving element (vibrator) were measured to obtain an electromechanical coupling coefficient $k_{33}'$ and a relative dielectric constant ($\epsilon_r=\epsilon_{33}^T/\epsilon_0$). As a consequence, $k_{33}'$ was 81 to 83%, and $\epsilon_r$ was 2200. In addition, since no depolarization of the single crystal occurred when the single crystal was cut, the variation in the piezoelectric characteristics of the strip vibrators was as small as 2% or less. In this example, the single crystal was formed in accordance with the flux method by using the platinum vessel. If growth is performed at a high temperature of 1100° to 1260° C., it is possible to obtain a single crystal with a similar composition position without adding a platinum compound such as PtO as a material, since Pt of the platinum vessel melts into a flux.

The above 91PZN-9PT-P single crystal was used to manufacture the array-type ultrasonic probe shown in FIG. 1 discussed above. That is, a 400 μm thick single-crystal piece was formed from the 91PZN-9PT-P single crystal, and a Ti/Au conductor film was deposited on the (001) face of this single-crystal piece by sputtering. Selective etching was then performed to remove a portion of the conductive film positioned on one side surface of the single-crystal piece and a portion of the conductive film positioned on the surface away from the ultrasonic transmitting/receiving surface. Subsequently, an acoustic matching layer was formed on the surface serving as the ultrasonic transmitting/receiving surface of the single-crystal piece. Thereafter, ground electrode plate was connected by a conductive paste to the conductive film which was mostly located on the ultrasonic transmitting/receiving surface of the single-crystal piece. Likewise, a flexible printed wiring board was connected by a conductive paste to the conductive film which was mostly located on the surface opposite to the ultrasonic transmitting/receiving surface of the single-crystal piece. The resultant structure was then bonded on a backing material with an epoxy resin. Subsequently, a portion from the acoustic matching layer to the single-crystal piece was cut at a pitch of 200 μm with a blade 50 μm thick by using a dicer. Upon cutting, separate piezoelectric elements 1 each having first and second electrodes 4 and 5 and a plurality of acoustic matching layers 6 each arranged on the piezoelectric element 1 were formed on the backing material 2. Note that the ground electrode plate 8 was connected to the first electrodes 4 with the conductive paste, and the flexible printed wiring board 9 was connected to the second electrodes 5 with the conductive paste. An acoustic lens 7 was then formed on the acoustic matching layers 6. Thereafter, a plurality of 110 pF/m, 2 m long coaxial cables were connected to the flexible printed wiring board 9, thereby manufacturing an array-type ultrasonic probe.

This ultrasonic probe was used to measure reflected echoes in accordance with a pulse echo method. Consequently, echoes having a center frequency of about 5 MHz were received by all of the ultrasonic transmitting/receiving elements.

EXAMPLE 2

Chemically high-purity PbO, ZnO, Nb$_2$O$_5$, TiO$_2$, Ta$_2$O$_5$, and PrO were used as starting materials. These materials were corrected in purity and weighed to yield a composition in which the molar ratio of lead zinc niobate (PZN) to lead titanate (PT) was 91:9, Nb contained in the PZN was partially substituted with Ta, and Ti contained in the PT was partially substituted with Pt. The resultant material was used to grow a solid-solution single crystal following the same procedures as in Example 1 by using the flux method. The obtained single crystal assumed a rectangular shape about 15 mm square. A portion of the single crystal was ground and subjected to X-ray diffraction to examine its crystal structure. Consequently, the single crystal was found to have a perovskite structure. The powder was then chemically analyzed with ICP and found to have the composition Pb{[M1$_{1/3}$Nb$_{(2/3)-(2z/3)}$Ta$_{2z/3}$]$_{1-x-y}$Ti$_x$M2$_y$}O$_3$ (M1; Zn, M2; Pt, x; 0.09, y; 0.0003, z; 0.003).

Following the same procedures as in Example 1, the resultant single crystal was subjected to electrode formation and depolarization and cut into strips. Thereafter, the capacitance, the resonant frequency, and the antiresonant frequency of each strip were measured to obtain the electromechanical coupling coefficient and the relative dielectric constant. As a consequence, the electromechanical coupling coefficient k$_{33}$' was 80 to 81%, and the relative dielectric constant $\epsilon_r$ was 2200. The variation in k$_{33}$' was as small as 1% or less.

EXAMPLE 3

Chemically high-purity PbO, ZnO, Nb$_2$O$_5$, TiO$_2$, and Fe$_2$O$_3$ were used as starting materials. These materials were corrected in purity and weighed to yield a composition in which the molar ratio of lead zinc niobate (PZN) to lead titanate (PT) was 91:9 and Ti contained in the PT was partially substituted with Fe. The resultant material was used to grow a solid-solution single crystal following the same procedures as in Example 1 by using the flux method. The obtained single crystal assumed a rectangular shape about 10 mm square. A portion of the single crystal was ground and subjected to X-ray diffraction to examine its crystal structure. Consequently, the single crystal was found to have a perovskite structure. The powder was then chemically analyzed with ICP and found to have the composition Pb[(M1$_{1/3}$Nb$_{2/3}$)$_{1-x-y}$Ti$_x$M2$_y$]O$_3$ (M1; Zn, M2; Fe, x; 0.09, y; 0.0003).

Following the same procedures as in Example 1, the resultant single crystal was subjected to electrode formation and depolarization and cut into strips. Thereafter, the capacitance, the resonant frequency, and the antiresonant frequency of each strip were measured to obtain the electromechanical coupling coefficient and the relative dielectric constant. As a consequence, the electromechanical coupling coefficient k$_{33}$' was 80 to 81%, and the relative dielectric constant $\epsilon_r$ was 2400. The variation in k$_{33}$' was as small as 1% or less.

EXAMPLE 4

Chemically high-purity pbO, ZnO, Nb$_2$O$_5$, TiO$_2$, and Bi$_2$O$_3$ were used as starting materials. These materials were corrected in purity and weighed to yield a composition in which the molar ratio of lead zinc niobate (PZN) to lead titanate (PT) was 91:9 and Ti contained in the PT was partially substituted with Bi. The resultant material was used to grow a solid-solution single crystal following the same procedures as in Example 1 by using the flux method. The obtained single crystal assumed a rectangular shape about 10 mm square. A portion of the single crystal was ground and subjected to X-ray diffraction to examine its crystal structure. Consequently, the single crystal was found to have a perovskite structure. The powder was then chemically analyzed with ICP and found to have the composition Pb[(Zn$_{1/3}$Nb$_{2/3}$)$_{1-x-y}$Ti$_x$M1$_y$]O$_3$ (M1; Bi, x; 0.09, y; 0.0003).

Following the same procedures as in Example 1, the resultant single crystal was subjected to electrode formation and depolarization and cut into strips. Thereafter, the capacitance, the resonant frequency, and the antiresonant frequency of each strip were measured to obtain the electromechanical coupling coefficient and the relative dielectric constant. As a consequence, the electromechanical coupling coefficient k$_{33}$' was 81 to 82%, and the relative dielectric constant $\epsilon_r$ was 3000. The variation in k$_{33}$' was as small as 1% or less.

EXAMPLE 5

Chemically high-purity PbO, ZnO, Nb$_2$O$_5$, TiO$_2$, Fe$_2$O$_3$, and PtO were used as starting materials. These materials were corrected in purity and weighed to yield a composition in which the molar ratio of lead zinc niobate (PZN) to lead titanate (PT) was 91:9 and Ti contained in the PT was partially substituted with Fe and Pt. The resultant material was used to grow a solid-solution single crystal following the same procedures as in Example 1 by using the flux method. The obtained single crystal assumed a rectangular shape about 15 mm square. A portion of the single crystal was ground and subjected to X-ray diffraction to examine its crystal structure. Consequently, the single crystal was found to have a perovskite structure. The powder was then chemically analyzed with ICP and found to have the composition Pb[(M1$_{1/3}$Nb$_{2/3}$)$_{1-x-y}$Ti$_x$M2$_y$]O$_3$ (M1; Zn, M2; Pt+Fe, x; 0.09, y; 0.0003).

Following the same procedures as in Example 1, the resultant single crystal was subjected to electrode formation and depolarization and cut into strips. Thereafter, the capacitance, the resonant frequency, and the antiresonant frequency of each strip were measured to obtain the electromechanical coupling coefficient and the relative dielectric constant. As a consequence, the electromechanical coupling coefficient k$_{33}$' was 80 to 81%, and the relative dielectric constant $\epsilon_r$ was 2300. The variation in k$_{33}$' was as small as 1% or less.

In Examples 1 to 5 described above, Pt, Fe, and Bi were used as the single-crystal component M2. Separately, single crystals were grown by using Rh$_2$O$_3$ and IrO$_2$ as starting materials containing the M2 component, in place of PtO or the like, and ultrasonic probes were manufactured by using these single crystals. Consequently, these ultrasonic probes were found to have good characteristics comparable to those obtained in Examples 1 to 5.

EXAMPLE 6

Chemically high-purity PbO, MgO, Nb$_2$O$_5$, TiO$_2$, and PtO were used as starting materials. These materials were corrected in purity and weighed to yield a composition in which the molar ratio of lead magnesium niobate (PMN) to lead titanate (PT) was 68:32 and Ti contained in the PT was partially substituted with Pt. The resultant material was used to grow a solid-solution single crystal following the same procedures as in Example 1 by using the flux method. The obtained single crystal assumed a rectangular shape about 15 mm square. A portion of the single crystal was ground and subjected to x-ray diffraction to examine its crystal structure. Consequently, the single crystal was found to have a perovskite structure. The powder was then chemically analyzed with ICP and found to have the composition Pb[(M1$_{1/3}$Nb$_{2/3}$)$_{1-x-y}$Ti$_x$M2$_y$]O$_3$ (M1; Mg, M2; Pt, x; 0.33, y; 0.0003).

Following the same procedures as in Example 1, the resultant single crystal was subjected to electrode formation and depolarization and cut into strips. Thereafter, the capacitance, the resonant frequency, and the antiresonant frequency of each strip were measured to obtain the electromechanical coupling coefficient and the relative dielectric constant. As a consequence, the electromechanical coupling coefficient k$_{33}$' was 81 to 83%, and the relative dielectric constant $\epsilon_r$ was 2900. The variation in k$_{33}$' was as small as 2% or less.

EXAMPLE 7

Chemically high-purity PbO, ZnO, MgO, Nb$_2$O$_5$, TiO$_2$, Fe$_2$O$_3$, and PrO were used as starting materials. These materials were corrected in purity and weighed to yield a composition in which the molar ratio of lead magnesium niobate (PMN), lead zinc niobate (PZN), and lead titanate (PT) was 34:45:21 and Ti contained in the PT was partially substituted with Pt and Fe. The resultant material was used to grow a solid-solution single crystal following the same procedures as in Example 1 by using the flux method. The obtained single crystal assumed a rectangular shape about 15 mm square. A portion of the single crystal was ground and subjected to X-ray diffraction to examine its crystal structure. Consequently, the single crystal was found to have a perovskite structure. The powder was then chemically analyzed with ICP and found to have the composition Pb[(M1$_{1/3}$Nb$_{2/3}$)$_{1-x-y}$Ti$_x$M2$_y$]O$_3$ (M1; Mg+Zn, M2; Pt+Fe, x; 0.21, y; 0.0003).

Following the same procedures as in Example 1, the resultant single crystal was subjected to electrode formation and depolarization and cut into strips. Thereafter, the capacitance, the resonant frequency, and the antiresonant frequency of each strip were measured to obtain the electromechanical coupling coefficient and the relative dielectric constant. As a consequence, the electromechanical coupling coefficient k$_{33}$' was 80 to 81%, and the relative dielectric constant $\epsilon_r$ was 2500. The variation in k$_{33}$' was as small as 2% or less.

In Examples 6 and 7 described above, Zn and Mg were used as the single-crystal component M1. Separately, a single crystal was grown by using NiO as a starting material containing the M1 component, in place of ZnO or the like, and an ultrasonic probe was manufactured by using this single crystal. Consequently, this ultrasonic probe was found to have good characteristics comparable to those obtained in Examples 6 and 7.

Comparative Example 1

Chemically high-purity PbO, ZnO, Nb$_2$O$_5$, and TiO$_2$ were used as starting materials. These materials were corrected in purity and weighed to yield a composition in which the molar ratio of lead zinc niobate (PZN) to lead titanate (PT) was 91:9. The resultant material was used to grow a solid-solution single crystal following the same procedures as in Example 1 by using the flux method, except that a rhodium vessel was used in place of the platinum vessel. The obtained single crystal assumed a rectangular shape about 10 mm square. A portion of the single crystal was ground and subjected to X-ray diffraction to examine its crystal structure. Consequently, the single crystal was found to have a perovskite structure. The powder was then chemically analyzed with ICP and found to have the composition Pb[(M1$_{1/3}$Nb$_{2/3}$)$_{1-x}$Ti$_x$]O$_3$ (M1; Zn, x; 0.10).

Following the same procedures as in Example 1, the resultant single crystal was subjected to electrode formation and depolarization and cut into strips. Thereafter, the capacitance, the resonant frequency, and the antiresonant frequency of each strip were measured to obtain the electromechanical coupling coefficient and the relative dielectric constant. As a consequence, the relative dielectric constant $\epsilon_r$ was 2000. The variation in the electromechanical coupling coefficients k$_{33}$' of the strip vibrators was also checked. Consequently, it was found that depolarization took place in some vibrators and the value of k$_{33}$' largely varied from 65 to 80%; i.e., the variation was 20%, a very large value.

Figure 9:
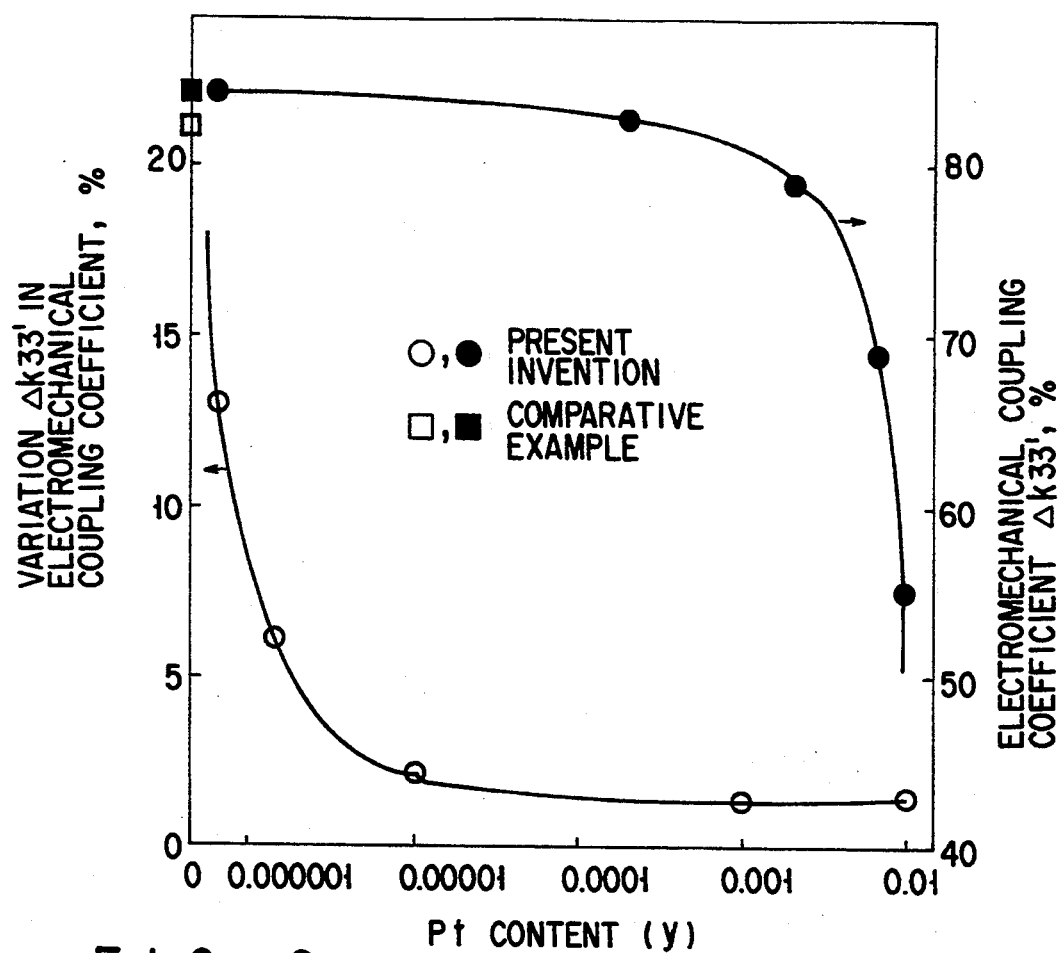
FIG. 9 is a graph showing the relationship between an electromechanical coupling coefficient $k_{33}'$ and a variation $\Delta k_{33}'$ in the electromechanical coupling coefficient of a vibrator having a piezoelectric element made of a piezoelectric single crystal according to the present invention, when the Pt content in the piezoelectric single crystal was changed.

The electromechanical coupling coefficient k$_{33}$' and its variation $\Delta$k$_{33}$' as functions of the pt content (y) were checked for the strip vibrators consisting of the PZN-PT single crystal containing Pt according to the present invention and the PZN-PT single crystal as the comparative example. The results are shown in FIG. 9. It is apparent from FIG. 9 that $\Delta$k$_{33}$' could be reduced without degrading k$_{33}$' if the Pt content, y, was within the range of $0.0001 \leq y \leq 0.01$ in Formula (I) mentioned earlier.

Characteristics analogous to those shown in FIG. 9 were also obtained when Ti was partially substituted with Fe, Bi, Rh, or Ir, in place of Pt, and when Nb was partially substituted with Ta.

EXAMPLE 8

Chemically high-purity PbO, Sc$_2$O$_3$, Nb$_2$O$_5$, TiO$_2$, and PtO were used as starting materials. These materials were corrected in purity and weighed to yield a composition in which the molar ratio of lead scandium niobate (PSN) to lead titanate (PT) was 56:44 and Ti contained in the PT was partially substituted with Pt. The resultant material was used to grow a solid-solution single crystal following the same procedures as in Example 1 by using the flux method, except that a flux with the composition 4PbO-1B$_2$O$_3$ was used. The obtained single crystal assumed a rectangular shape about 15 mm square. A portion of the single crystal was ground and subjected to X-ray diffraction to examine its crystal structure. Consequently, the single crystal was found to have a perovskite structure. The powder was then chemically analyzed with ICP and found to have the composition Pb$\{$[M3$_{1/2}$Nb$_{1/2}$]$_{1-x-y}$Ti$_x$M2$_y\}$O$_3$ (M3; Sc, M2; Pt, x; 0.44, y; 0.0003).

Following the same procedures as in Example 1, the resultant single crystal was subjected to electrode formation and depolarization and cut into strips. Thereafter, the capacitance, the resonant frequency, and the antiresonant frequency of each strip were measured to obtain the electromechanical coupling coefficient and the relative dielectric constant. As a consequence, the electromechanical coupling coefficient k$_{33}$' was 80 to 82%, and the relative dielectric constant $\epsilon_r$ was 1400. The variation in k$_{33}$' was as small as 2% or less.

EXAMPLE 9

Chemically high-purity PbO, Sc$_2$O$_3$, Nb$_2$O$_5$, TiO$_2$, Ta$_2$O$_3$, and PtO were used as starting materials. These materials were corrected in purity and weighed to yield a composition in which the molar ratio of lead scandium niobate (PSN) to lead titanate (PT) was 56:44, Nb contained in the PSN was partially substituted with Ta, and Ti contained in the PT was partially substituted with Pt. The resultant material was used to grow a solid-solution single crystal following the same procedures as in Example 1 by using the flux method, except that a flux with the composition 4PbO-1B$_2$O$_3$ was used. The obtained single crystal assumed a rectangular shape about 15 mm square. A portion of the single crystal was ground and subjected to X-ray diffraction to examine its crystal structure. Consequently, the single crystal was found to have a perovskite structure. The powder was then chemically analyzed with ICP and found to have the composition Pb$\{$[M3$_{1/2}$Nb$_{(1/2)-(z/2)}$Ta$_{z/2}$]$_{1-x-y}$Ti$_x$M2$_y\}$O$_3$ (M3; Sc, M2; Pt, x; 0.44, y; 0.0004, z; 0.003).

Following the same procedures as in Example 1, the resultant single crystal was subjected to electrode formation and depolarization and cut into strips. Thereafter, the capacitance, the resonant frequency, and the antiresonant frequency of each strip were measured to obtain the electromechanical coupling coefficient and the relative dielectric constant. As a consequence, the electromechanical coupling coefficient k$_{33}$' was 84 to 85%, and the relative dielectric constant $\epsilon_r$ was 2000. The variation in k$_{33}$' was as small as 1% or less.

In Examples 8 and 9 described above, Pt was used as the single-crystal component M2. Separately, single crystals were grown by using Fe$_2$O$_3$, Bi$_2$O$_3$,Rh$_2$O$_3$, and IrO$_2$ as starting materials containing the M2 component, in place of PrO or the like, and ultrasonic probes were manufactured by using these single crystals. Consequently, these ultrasonic probes were found to have good characteristics comparable to those obtained in Examples 8 and 9.

Also, Sc was used as the single-crystal component M3 in Examples 8 and 9. Separately, a single crystal was grown by using In$_2$O$_3$ as a starting material containing the M3 component, in place of Sc$_2$O$_3$, and an ultrasonic probe was manufactured by using this single crystal. Consequently, it was found that this ultrasonic probe had good characteristics comparable to those obtained in Examples 8 and 9.

EXAMPLE 10

(Making of a seed crystal)

PbO, ZnO, Nb$_2$O$_5$, TiO$_2$, and PtO were used as starting materials. These materials were corrected in purity and weighed to yield a composition in which the molar ratio of lead zinc niobate (PZN) to lead titanate (PT) was 88:12 and Ti contained in the PT was partially substituted with Pt. In addition, an equal quantity of PbO was added as a flux. The resultant powder was added with pure water and mixed in a ball mill containing ZrO$_2$ balls for one hour. After water was removed from the resultant mixture, the mixture was ground sufficiently by a grinder, placed in a rubber mold, and rubber-pressed at a pressure of 2 tons/cm$^2$. A 600 g portion of the solid matter extracted from the rubber mold was placed in a platinum vessel 50 mm in diameter and 250 cc in volume and melted by heating to a temperature of 1250° C. over five hours. The material was gradually cooled to 800° C. at a rate of 0.8° C./hr and then cooled to room temperature. Thereafter, 20% nitric acid was added to the platinum vessel and boiled for eight hours, and the resultant solid-solution single crystal was extracted. A portion of the single crystal was ground and subjected to X-ray diffraction. Consequently, the single crystal was found to have a good crystal structure. Thereafter, the orientation of the <001> axis of the single crystal was determined by using a Laue camera, and the single crystal was cut in a direction perpendicular to that axis. After being cut, the crystal was attached as a seed crystal to a platinum rod.

(Growth of a single crystal having a solid-solution quantity distribution of lead titanate)

PbO, ZnO, Nb$_2$O$_5$, TiO$_2$, and PrO were corrected in purity and weighed to yield a composition in which the molar ratio of lead zinc niobate (PZN) to lead titanate (PT) was 88:12 and Ti contained in the PT was partially substituted with Pt. In addition, the material was added with a flux such that PZN-PT: PbO=25 mol %: 75 mol %, and mixed by a ball mill. After water was removed from the resultant mixture, the mixture was sufficiently ground by a grinder, placed in a rubber mold, and rubber-pressed at a pressure of 2 tons/cm$^2$. The resultant solid matter extracted from the rubber vessel was placed in a platinum vessel 50 mm in diameter and 250 cc in volume and completely melted by heating to a temperature of 970° C. The seed crystal formed as described above was dipped in this molten product, and the platinum rod to which the seed crystal was attached was pulled up at a rotating speed of 60 rpm and a pulling rate of 0.1 mm/hr, thereby growing a single crystal. In this pulling step, a material powder of PZN that was separately prepared was started to be added to the platinum vessel at the same time the pulling was started, and continuously added until the length of the grown crystal became 10 mm. Note that the addition amount was determined so that the molar fraction of PZN to PT was 91:9 when the pulled length was 10 mm. Thereafter, the pulling was continued by changing the additive to a material powder of PT. The addition amount was so determined that the molar fraction of PZN to PT was 88:12 when the pulled length was 10 mm. In this manner, a crystal 20 mm long was grown.

Subsequently, the grown crystal was cut along the pulling direction by using a cutter to form a crystal piece about 500 μm in thickness. This crystal was then abraded to a thickness of 250 μm with an abrasive of #2000. The abraded crystal piece was cleaned well with alcohol and acetone, and Ti/Au electrodes (thicknesses 0.05 μm/0.5 μm) were formed on both the surfaces of the crystal piece by sputtering. Subsequently, the resultant crystal piece was dipped in silicone oil, heated to a temperature of 200° C., and then cooled to 40° C. while an electric field of 1 kv/mm was applied. The obtained ultrasonic transmitting/receiving element (vibrator) was cut at a width of about 150 μm in a direction perpendicular to the pulling direction of the crystal piece, thereby manufacturing a plurality of strip vibrators different in PT molar fraction.

Figure 10:
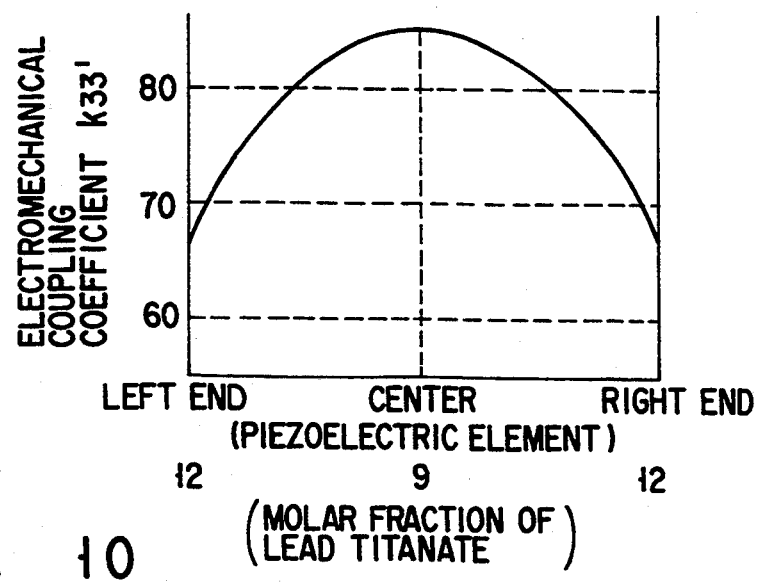
FIG. 10 is a graph showing the electromechanical coupling coefficient of a vibrator having a piezoelectric element according to one embodiment of the present invention as a function of the change in concentration of lead titanate contained in the piezoelectric element.

The resonant frequency and the antiresonant frequency of each resultant strip vibrator were measured to obtain an electromechanical coupling coefficient $k_{33}'$. FIG. 10 shows the electromechanical coupling coefficient $k_{33}'$ as a function of the position of the vibrator before the cutting, i.e., $k_{33}'$ as a function of the PT molar fraction. FIG. 10 reveals that $k_{33}'$ was at a maximum when the PT molar fraction was 9% and decreased as the PT molar fraction increased.

Subsequently, the above single-crystal piece was used to manufacture the array-type ultrasonic probe shown in FIG. 1 discussed above. That is, a 400 μm thick single-crystal piece was formed from the single crystal, and a Ti/Au conductor film was vapor-deposited on the (001) face of this single-crystal piece. Selective etching was then performed to remove a portion of the conductive film positioned on one side surface of the single-crystal piece and a portion of the conductive film positioned on the surface away from the ultrasonic transmitting/receiving surface. Subsequently, an acoustic matching layer was formed on the surface, serving as the ultrasonic transmitting/receiving surface, of the single-crystal piece. Thereafter, ground electrode plate was connected by a conductive paste to the conductive film which was mostly located on the ultrasonic transmitting/receiving surface of the single-crystal piece. Likewise, a flexible printed wiring board was connected by a conductive paste to the conductive film which was mostly located on the surface opposite to the ultrasonic transmitting/receiving surface of the single-crystal piece. Subsequently, the resultant structure was bonded on a backing material with an epoxy resin. A portion from the acoustic matching layer to the single-crystal piece was cut at a pitch of 200 μm with a blade 50 μm thick by using a dicer. Upon cutting, separate piezoelectric elements 1 each having first and second electrodes 4 and 5 and a plurality of acoustic matching layers 6 each arranged on the piezoelectric element 1 were formed on the backing material 2. Note that the PT molar fraction changed along the slice direction of the piezoelectric element 1 and was a minimum in a central portion. Note also that the ground electrode plates 8 were connected to the first electrodes 4 with the conductive paste, and the flexible printed wiring board 9 was connected to the second electrodes 5 with the conductive paste. An acoustic lens 7 was then formed on the acoustic matching layers 6. Thereafter, a plurality of cables were connected to the flexible printed wiring board 9, thereby manufacturing an array-type ultrasonic probe.

Figure 11:
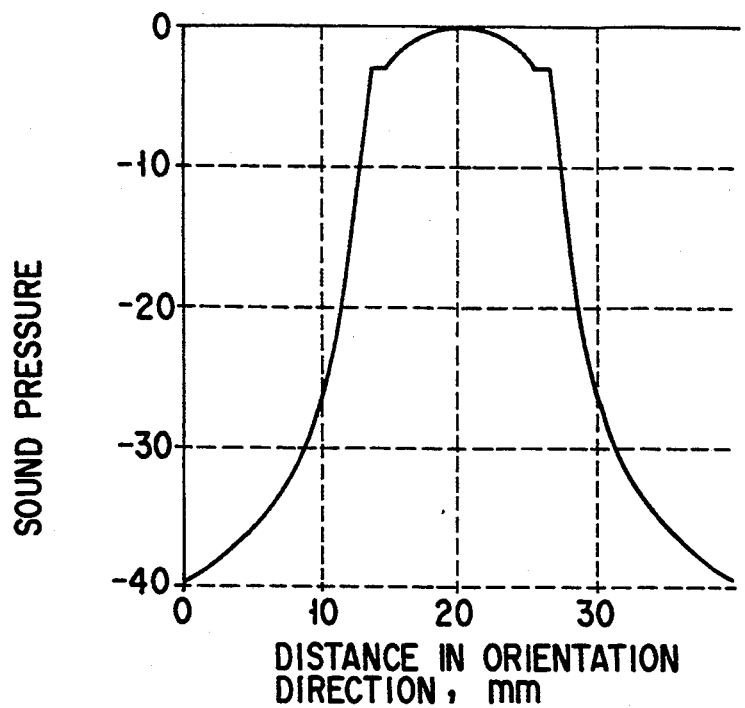
FIG. 11 is a graph showing a transmission sound field in a slice direction of an ultrasonic probe in Example 10 of the present invention.
Figure 12:
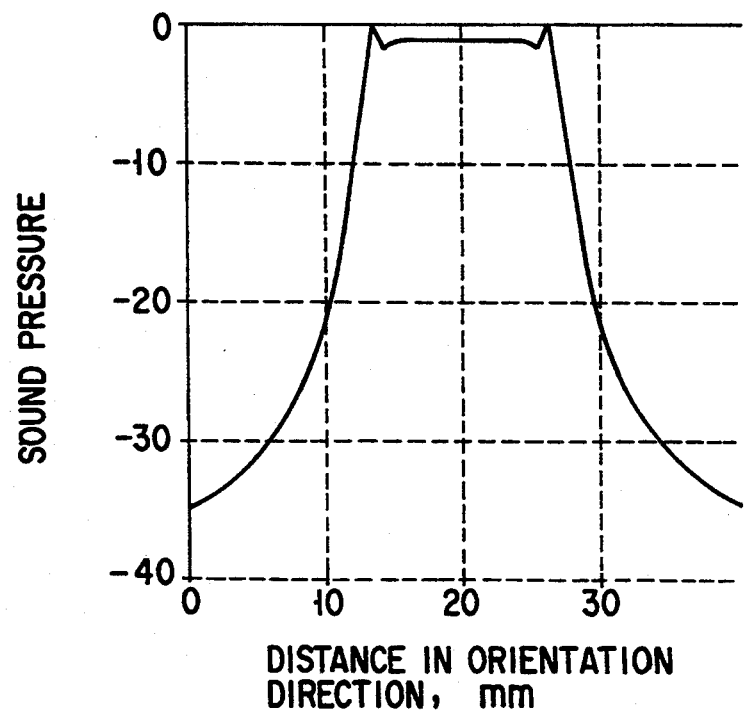
FIG. 12 is a graph showing a transmission sound field in a slice direction of an ultrasonic probe in Example 11 of the present invention.

A sound field of the above ultrasonic probe was measured in the slice direction. In addition, as Example 11, an analogous sound field measurement was performed for an ultrasonic probe having piezoelectric elements made from a single crystal in which the PT molar fraction in the slice direction was constant (12%). FIG. 11 shows the sound field measurement result of the ultrasonic probe of Example 10; and FIG. 12 shows that of the ultrasonic probe of Example 11. Note that, in FIGS. 11 and 12, the acoustic pressure indicates the values measured in a vertical plane at a depth of 7 mm in the direction of the sound field.

As can be seen from FIGS. 11 and 12, the sound pressures at the end portions were higher than that at the peak of the main wave in the ultrasonic probe of Example 11, whereas the sound pressure of the main wave was higher in the ultrasonic probe of Example 10. This indicates that a high-resolution sound field with a narrow beam width could be generated in Example 10.

In Example 10 discussed above, a single crystal was manufactured by the pulling method. However, a single crystal also can be formed by, e.g., a flux method or a Bridgeman method, provided that the molar fraction of lead titanate is changed.

In addition, although Example 10 has been described by taking the electronic scanning ultrasonic probe as an example, the present invention is similarly applicable to a mechanical scanning ultrasonic probe constituted by a single probe or the like. In an ultrasonic probe with such a structure, e.g., in the case of a circular (disk-like) probe, the molar fraction of lead titanate in the composition is so set that the electromechanical coupling coefficient is large in a central portion and gradually decreases toward the outer periphery.

EXAMPLE 12

A single crystal grown following the same procedures as in Example 1 and having the composition $Pb[(M1_{1/3}Nb_{2/3})_{1-x-y}Ti_xM2_y]O_3$ (M1; Zn, M2; Pt, x; 0.09, y; 0.0001) was used. The orientation of the [001] axis of this single crystal was determined by using a Laue camera, and the single crystal was cut in a direction perpendicular to that axis by using a cutter. The cut single crystal was mirror-polished and processed in outer shape, thereby manufacturing a rectangular single-crystal piece 300 μm thick and 8 mm square.

Figure 4:
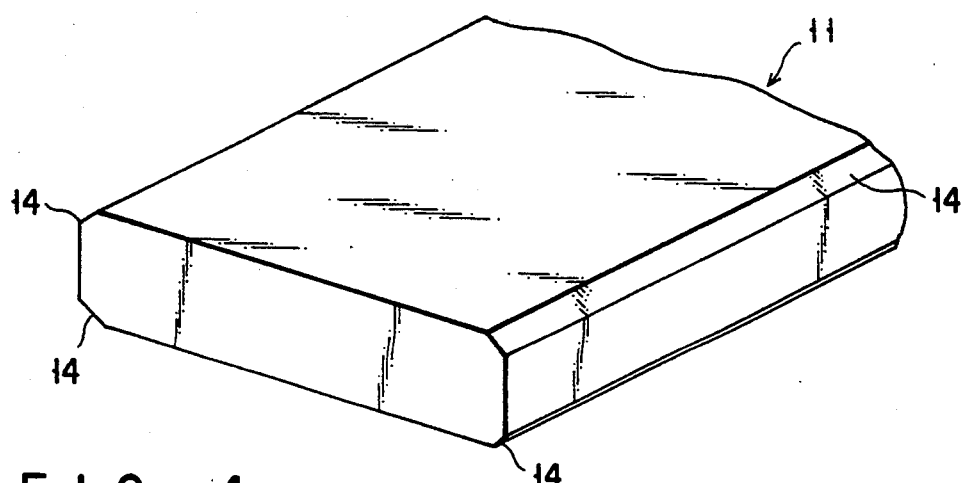
FIG. 4 is a perspective view showing a rectangular piezoelectric single crystal whose four parallel edges are chamfered.

Subsequently, the edges of the above rectangular single-crystal piece extending in a direction perpendicular to the slice direction in a slicing step (to be described later) were chamfered by an amount of 1/20 (15 μm) the thickness (t) of the single-crystal plate 1 with an alumina powder of No. 400 by using a ceramic chamfering machine, forming chamfered portions 14 in the rectangular single-crystal piece 11, as illustrated in FIG. 4. Subsequently, as in FIG. 3A, a conductive film was deposited on the rectangular single-crystal piece 11 having the chamfered portions 14 by sputtering, and was left behind on the ultrasonic transmitting/receiving surface and the surface opposite to the transmitting/receiving surface by selective etching. After an electric field of 1 kv/mm was applied between the conductive films for 30 minutes in silicone oil at 150° to 200° C., the resultant single-crystal piece was cooled to 40° C. while the electric field was kept applied. Thereafter, as in FIG. 3B, an acoustic matching layer 13 was formed on the surface, serving as the ultrasonic transmitting/receiving surface, of the single-crystal piece 11, and the resultant structure was bonded on a backing material 2. Subsequently, a portion from the acoustic matching layer 13 to the single-crystal piece 11 was cut a plurality of number of times in a direction indicated by the alternate long and short dashed lines in FIG. 3B by using a blade. In this fashion, 50 strip vibrators 120 μm in width were formed on the backing material 2.

EXAMPLES 13-18

In Examples 13, 14, 15, 16, 17, and 18, strip vibrators were formed on backing materials following the same procedures as in Example 12 except that the edges of single-crystal pieces having the same dimensions and composition as in Example 12 were chamfered by amounts of 1/16, 1/10, ⅛, 1/5, ¼, and ⅓ the thickness of the single-crystal plate, respectively, with an alumina powder of No. 400 by using a ceramic chamfering machine. In this manner, 50 vibrators were formed on the backing material in each example.

EXAMPLE 19

50 vibrators were formed on a backing material following the same procedures as in Example 12 except that a single-crystal piece having the same dimensions and composition as in Example 12 and also having edges was used.

Comparative Examples 2 & 3

50 strip vibrators were formed on a backing material in each of Comparative Examples 2 and 3 following the same procedures as in Example 12 except that a PZT-based piezoelectric ceramic plate having the same dimensions as the single-crystal piece used in Example 12 was used in place of the single-crystal piece, and that the edges of this PZT-based piezoelectric ceramic plate were not chamfered, in Comparative Example 2, and were chamfered by an amount of 1/5 the thickness of that plate, in Comparative Example 3.

The presence/absence of cracks in these strip vibrators of Examples 12 to 19 and Comparative Examples 2 and 3 was checked by observing the vibrators with a microscope. The number of samples was 100, i.e., two single-crystal plates on which electrodes were formed were taken as samples for each of the 50 strip vibrators. In addition, the capacitances of these vibrators were measured, and the maximum value of decreases from the mean value was defined as the capacitance variation. If cracks were found in a plurality of portions of strip vibrators, the value of a vibrator with the largest crack was used. Furthermore, the resonant and antiresonant frequencies of each strip vibrator were measured to obtain an electromechanical coupling coefficient $k_{33}'$. These results are given in Table 1 below.

TABLE 1

|  | Degree of chamfering | $K_{33}'$ (%) | Ratio of cracks in vibrators (%) | Capacitance variation (%) |
| --- | --- | --- | --- | --- |
| Example 12 | t/20 | 82 | 0 | −2 |
| Example 13 | t/16 | 82 | 0 | −2 |
| Example 14 | t/10 | 81 | 0 | −2 |
| Example 15 | t/8 | 81 | 0 | −2 |
| Example 16 | t/5 | 81 | 0 | −2 |
| Example 17 | t/4 | 80 | 0 | −2 |
| Example 18 | t/3 | 79 | 0 | −2 |
| Example 19 | 0 | 83 | 3 | −4 |
| Comparative | 0 | 68 | 0 | −2 |

TABLE 1-continued

|  | Degree of chamfering | $K_{33}'$ (%) | Ratio of cracks in vibrators (%) | Capacitance variation (%) |
| --- | --- | --- | --- | --- |
| Example 2 Comparative Example 3 | t/5 | 67 | 0 | −3 |

As can be seen from Table 1 above, the value of $k_{33}'$ of any of the vibrators obtained in Examples 12 to 19 was higher than those of the vibrators of Comparative Examples 2 and 3. Table 1 also reveals that it was possible to prevent cracks in the piezoelectric elements and to reduce variations in the capacitances of the strip vibrators manufactured from these piezoelectric elements, when the edges of the single-crystal piece were chamfered by an amount of 1/20 to ⅓ the thickness (t) of that single-crystal piece before the single-crystal piece was sliced, as in Examples 12 to 18, as compared with Example 19 in which no chamfering was performed at all. In addition, as in Comparative Examples 2 and 3, no cracks were formed regardless of whether or not chamfering was performed, if the PZT-based ceramic plate was used as the piezoelectric material.

EXAMPLE 20

A single crystal grown following the same procedures as in Example 8 and having the composition Pb{[(M3$_{1/2}$Nb$_{1/2}$)$_{1-x-y}$Ti$_x$M2$_y$]}O$_3$ (M3; Sc, M2; Pt, x; 0.44, y; 0.0003) was used. The orientation of the [001] axis of this single crystal was determined by using a Laue camera, and the single crystal was cut in a direction perpendicular to that axis by using a cutter. The cut single crystal was mirror-polished and processed in outer shape, thereby manufacturing a rectangular single-crystal piece 30 μm thick and 8 mm square.

Subsequently, the edges of the above rectangular single-crystal piece extending in a direction perpendicular to the slice direction in a slicing step (to be described later) were chamfered by an amount of 1/20 (15 μm) the thickness (t) of the single-crystal plate 1 with an alumina powder of No. 400 by using a ceramic chamfering machine, forming chamfered portions 14 in the rectangular single-crystal piece 11, as illustrated in FIG. 4. Subsequently, as in FIG. 3A, a conductive film was deposited on the rectangular single-crystal piece 11 having the chamfered portions 14 by sputtering, and was left behind on the ultrasonic transmitting/receiving surface and the surface opposite to the transmitting/receiving surface by selective etching. After an electric field of 1 kv/mm was applied between the conductive films for 30 minutes in silicone oil at 150° to 200° C., the resultant single-crystal piece was cooled to 40° C. while the electric field was kept applied. Thereafter, as in FIG. 3B, an acoustic matching layer 13 was formed on the surface, serving as the ultrasonic transmitting/receiving surface, of the single-crystal piece 11, and the resultant structure was bonded on a backing material 2. Subsequently, a portion from the acoustic matching layer 13 to the single-crystal piece 11 was cut a plurality of number of times in a direction indicated by the alternate long and short dashed lines in FIG. 3B by using a blade. In this fashion, 50 strip vibrators 120 μm in width were formed on the backing material 2.

EXAMPLES 21-26

In Examples 21, 22, 23, 24, 25, and 26, strip vibrators were formed on backing materials following the same procedures as in Example 20 except that the edges of 5 single-crystal pieces having the same dimensions and composition as in Example 20 were chamfered by amounts of 1/16, 1/10, ⅛, 1/5, ¼, and ⅓ the thickness of the single-crystal plate, respectively, with an alumina powder of No. 400 by using a ceramic chamfering machine. In this manner, 50 vibrators were formed on the backing material in each example.

EXAMPLE 27

50 vibrators were formed on a backing material following the same procedures as in Example 20 except that a single-crystal piece having the same dimensions and composition as in Example 20 and also having edges was used.

TABLE 2

|  | Degree of chamfering | $K_{33}'$ (%) | Ratio of cracks in vibrators (%) | Capacitance variation (%) |
|---|---|---|---|---|
| Example 20 | t/20 | 82 | 0 | −2 |
| Example 21 | t/16 | 82 | 1 | −2 |
| Example 22 | t/10 | 82 | 0 | −2 |
| Example 23 | t/8 | 82 | 0 | −2 |
| Example 24 | t/5 | 82 | 0 | −2 |
| Example 25 | t/4 | 80 | 1 | −2 |
| Example 26 | t/3 | 80 | 2 | −2 |
| Example 27 | 0 | 81 | 3 | −4 |

It is apparent from Table 2 above that it was possible to prevent cracks in the piezoelectric elements and to reduce variations in the capacitances of the strip vibrators manufactured from these piezoelectric elements, when the single-crystal material consisting of PSN-PT in which Ti was partially substituted with Pt was used, and the edges of the single-crystal piece were chamfered by an amount of 1/20 to ⅓ the thickness (t) of that single-crystal piece before the single-crystal piece was sliced, as in Examples 20 to 26, as compared with Example 27 in which no chamfering was performed at all.

EXAMPLES 28-30

(Making of a seed crystal)

PbO, ZnO, Nb$_2$O$_5$, TiO$_2$, and PtO were used as starting materials. These materials were corrected in purity and weighed to yield a composition in which the molar ratio of lead zinc niobate (PZN) to lead titanate (PT) was 88:12 and Ti contained in the PT was partially substituted with Pt. In addition, an equal quantity of PbO was added as a flux. The resultant powder was added with pure water and mixed in a ball mill containing ZrO$_2$ balls for one hour. After water was removed from the resultant mixture, the mixture was ground sufficiently by a grinder, placed in a rubber mold, and rubber-pressed at a pressure of 2 tons/cm$^2$. A 600 g portion of the solid matter extracted from the rubber mold was placed in a platinum vessel 50 mm in diameter and 250 cc in volume and melted by heating to a temperature of 1250° C. over five hours. The material was gradually cooled to 800° C. at a rate of 0.8° C./hr and then cooled to room temperature. Thereafter, 20% nitric acid was added to the platinum vessel and boiled for eight hours, and the resultant solid-solution single crystal was extracted. A portion of the single crystal was ground and subjected to X-ray diffraction. Consequently, the single crystal was found to have a good perovskite crystal structure. Thereafter, the orientation of the <001> axis of the single crystal was determined by using a Laue camera, and the single crystal was cut in a direction perpendicular to that axis. After being cut, the crystal was attached as a seed crystal to a platinum rod.

(Growth of a single crystal)

PbO, ZnO, Nb$_2$O$_5$, TiO$_2$, and PtO were corrected in purity and weighed to yield a composition in which the molar ratio of lead zinc niobate (PZN) to lead titanate (PT) was 91:9 and Ti contained in the PT was partially substituted with Pt. In addition, the material was added with a flux such that PZN-PT: PbO=25 mol %: 75 mol %, and was mixed by a ball mill. After water was removed from the resultant mixture, the mixture was sufficiently ground by a grinder, placed in a rubber mold, and rubber-pressed at a pressure of 2 tons/cm$^2$. The resultant solid matter extracted from the rubber vessel was placed in a platinum vessel 50 mm in diameter and 250 cc in volume and completely melted by heating to a temperature of 970° C. The seed crystal formed as described above was dipped in this molten product, and the platinum rod to which the seed crystal was attached was pulled up at a rotating speed of 60 rpm and a pulling rate of 0.1 mm/hr, thereby growing a single crystal. The resultant single crystal was found by a chemical analysis using ICP to have the composition Pb[(M1$_{1/3}$Nb$_{2/3}$)$_{1-x-y}$Ti$_x$M2$_y$]O$_3$ (M1; Zn, M2; Pt, x; 0.09, y; 0.0001). Note that a single crystal with a composition in which x is within the range of $0.05 \leq x \leq 0.20$ has a cleavage plane on the (111) plane.

Figure 6:
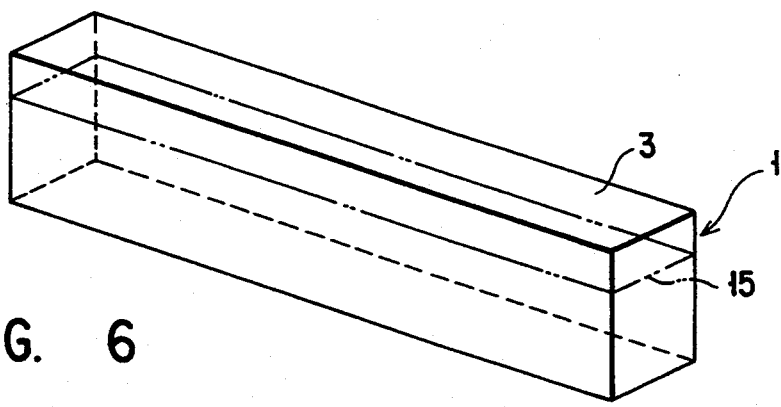
FIG. 6 is a perspective view for explaining the positional relationship between an ultrasonic transmitting/receiving surface and a cleavage plane of a strip piezoelectric element consisting of a single crystal having the cleavage plane.

Subsequently, the orientations of the (100), (111), and (110) planes of the grown single crystal were determined by using a Laue camera, and the single crystal was so cut that each individual orientation plane served as the major surface (ultrasonic transmitting/receiving surface), thereby manufacturing three types of rectangular single-crystal pieces 0.3 mm thick, 20 mm long, and 10 mm wide. Subsequently, as in FIG. 3A, a conductive film was deposited on the rectangular single-crystal piece 11 having the chamfered portions 14 by sputtering, and was left behind on the ultrasonic transmitting/receiving surface and the surface opposite to the transmitting/receiving surface by selective etching. After an electric field of 1 kv/mm was applied between the conductive films for 30 minutes in silicone oil at 150° to 200° C., the resultant single-crystal piece was cooled to 40° C. while the electric field was kept applied. Thereafter, as in FIG. 3B, an acoustic matching layer 13 was formed on the surface, serving as the ultrasonic transmitting/receiving surface, of the single-crystal piece 11, and the resultant structure was bonded on a backing material 2. Subsequently, a portion from the acoustic matching layer 13 to the single-crystal piece 11 was cut a plurality of number of times in a direction indicated by the alternate long and short dashed lines in FIG. 3B by using a blade 50 μm thick. In this fashion, 100 strip vibrators 150 μm in width were formed on the backing material 2. Note that the ultrasonic transmitting/receiving surface 3 was parallel to the cleavage plane 15, as shown in FIG. 6 discussed earlier, in the piezoelectric element of the strip vibrator formed by slicing, with the blade, the rectangular single-crystal piece which was cut such that the (111) orientation plane determined as described above served as the major surface (ultrasonic transmitting/receiving surface).

The ratio of defective vibrators (of a total of 100 arrayed vibrators) in which cracks or the like were produced in piezoelectric elements during the course of a series of the vibrator manufacturing steps described above was measured. The results are shown in Table 3 below.

TABLE 3

| | | Failure rate arrayed vibrators |
|---|---|---|
| Example 28 | Orientation of ultrasonic transmitting/receiving surface of piezoelectric element was (100) plane | 1% |
| Example 29 | Orientation of ultrasonic transmitting/receiving surface of piezoelectric element was (110) plane | 1% |
| Example 30 | Orientation of ultrasonic transmitting/receiving surface of piezoelectric element was (111) plane | 0% |

As is apparent from Table 3, in the arrayed vibrators having the piezoelectric elements whose ultrasonic transmitting/receiving surfaces were parallel to the cleavage plane, i.e., in the vibrators having the piezoelectric elements whose ultrasonic transmitting/receiving surfaces were parallel to the (111) plane as the cleavage plane of a single crystal, as in Example 30, no cracks were formed in the piezoelectric elements, so the rate of failures caused by cracks was zero.

In each of the above examples, the piezoelectric single crystal was made by the flux method. However, it is also possible to make the piezoelectric single crystal by, e.g., a Bridgeman method, a Kyropoulos' method (a melt pulling method), or a hydrothermal growth method.

In the above examples, the electrodes were formed by sputtering. However, a silver baking process or a vapor deposition process also can be used. In addition, the electrode material is not particularly limited to Ni/Au but may be any material, such as Cr/Au, provided that the material has a predetermined conductivity and adhesion strength.

As has been discussed above, the present invention can provide a piezoelectric single crystal which has a large electromechanical coupling coefficient ($k_{33}'$), which does not bring about depolarization when processed into strip piezoelectric elements or during the manufacture of an ultrasonic probe, and which can prevent degradation in performance resulting from changes with time even after being used for long periods of time.

The present invention can also provide an ultrasonic probe including an ultrasonic transmitting/receiving element having a piezoelectric element which is made of a single crystal consisting essentially of Formula (I) or (II), has a large electromechanical coupling coefficient, and can discourage depolarization resulting from the influence of heat. This ultrasonic probe has a higher sensitivity and a higher reliability than those of an ultrasonic probe having a piezoelectric element made of a conventional PZT-based piezoelectric ceramic.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A piezoelectric single crystal consisting essentially of a general formula:

$$Pb\{[M1_{1/3}Nb_{(2/3)-(2z/3)}Ta_{2z/3}]_{1-x-y}Ti_xM2_y\}O_3$$

wherein M1 represents at least one metal selected from the group consisting of Zn, Ni, and Mg, M2 represents at least one metal selected from the group consisting of Pt, Fe, Bi, Rh, and Ir, and x, y, and z are defined as $0.05 \leq x \leq 0.2$, $0.00001 \leq y \leq 0.01$, and $0 \leq z \leq 0.1$, respectively.

2. A piezoelectric single crystal according to claim 1, wherein z in the formula is $z > 0$.

3. A piezoelectric single crystal consisting essentially of a general formula:

$$Pb\{[M3_{1/2}Nb_{(1/2)-(z/2)}Ta_{z/2}]_{1-x-y}Ti_xM2_y\}O_3$$

wherein M2 represents at least one metal selected from the group consisting of Pt, Fe, Bi, Rh, and Ir, M3 represents at least one metal selected from the group consisting of Sc and In, and x, y, and z are defined as $0.2 \leq x \leq 0.6$, $0.00001 \leq y \leq 0.01$, and $0 \leq z \leq 0.1$, respectively.

4. A piezoelectric single crystal according to claim 3, wherein z in the formula is $z > 0$.

5. An ultrasonic probe comprising:
a piezoelectric element having an ultrasonic transmitting/receiving surface; and
a pair of electrodes formed on the ultrasonic transmitting/receiving surface of said piezoelectric element and a surface opposite to said ultrasonic transmitting/receiving surface, respectively, and
wherein said piezoelectric element is made of a single crystal consisting essentially of a general formula:

$$Pb\{[M1_{1/3}Nb_{(2/3)-(2z/3)}Ta_{2z/3}]_{1-x-y}Ti_xM2_y\}O_3$$

wherein M1 represents at least one metal selected from the group consisting of Zn, Ni, and Mg, M2 represents at least one metal selected from the group consisting of Pt, Fe, Bi, Rh, and Ir, and x, y, and z are defined as $0.05 \leq x \leq 0.2$, $0.00001 \leq y \leq 0.01$, and $0 \leq z \leq 0.1$, respectively.

6. An ultrasonic probe according to claim 5, wherein z in the formula is $z > 0$.

7. An ultrasonic probe according to claim 5, wherein z in the formula is $0.01 \leq z \leq 0.1$.

8. An ultrasonic probe according to claim 5, wherein, in said piezoelectric element, a solid-solution quantity of lead titanate is smallest in a central portion of said ultrasonic transmitting/receiving surface and increases gradually toward end portions of said surface.

9. An ultrasonic probe according to claim 5, wherein said piezoelectric single crystal assumes a rectangular shape whose four parallel edges are chamfered, and said piezoelectric element is formed by slicing said single crystal in a direction perpendicular to a longitudinal direction of said chamfered portions.

10. An ultrasonic probe according to claim 5, wherein said piezoelectric element is formed by cutting out from said single crystal having a cleavage plane such that said ultrasonic transmitting/receiving surface forms an angle of not more than 20° with the cleavage plane.

11. An ultrasonic probe comprising:
a piezoelectric element having an ultrasonic transmitting/receiving surface; and
a pair of electrodes formed on the ultrasonic transmitting/receiving surface of said piezoelectric element and a surface opposite to said ultrasonic transmitting/receiving surface, respectively, and
wherein said piezoelectric element is made of a single crystal consisting essentially of a general formula:

$$Pb\{[M3_{1/2}Nb_{(1/2)-(z/2)}Ta_{z/2}]_{1-x-y}Ti_xM2_y\}O_3$$

wherein $M_2$ represents at least one metal selected from the group consisting of Pt, Fe, Bi, Rh, and Ir, M3 represents at least one metal selected from the group consisting of Sc and In, and x, y, and z are defined as $0.2 \leq x \leq 0.6$, $0.00001 \leq y \leq 0.01$, and $0 \leq z \leq 0.1$, respectively.

12. An ultrasonic probe according to claim 11, wherein z in the formula is $z > 0$.

13. An ultrasonic probe according to claim 11, wherein z in the formula is $0.01 \leq z \leq 0.1$.

14. An ultrasonic probe according to claim 11, wherein, in said piezoelectric element, a solid-solution quantity of lead titanate is smallest in a central portion of said ultrasonic transmitting/receiving surface and increases gradually toward end portions of said surface.

15. An ultrasonic probe according to claim 11, wherein said piezoelectric single crystal assumes a rectangular shape whose four parallel edges are chamfered, and said piezoelectric element is formed by slicing said single crystal in a direction perpendicular to a longitudinal direction of said chamfered portions.

16. An ultrasonic probe according to claim 11, wherein said piezoelectric element is formed by cutting out from said single crystal having a cleavage plane such that said ultrasonic transmitting/receiving surface forms an angle of not more than 20° with the cleavage plane.

17. An array-type ultrasonic probe comprising:
a plurality of piezoelectric elements aligned and each having an ultrasonic transmitting/receiving surface; and
a pair of electrodes formed on the ultrasonic transmitting/receiving surface of each piezoelectric element and a surface opposite to said ultrasonic transmitting/receiving surface, respectively, and
wherein said piezoelectric element is made of a single crystal consisting essentially of a general formula:

$$Pb\{[M1_{1/3}Nb_{(2/3)-(2z/3)}Ta_{2z/3}]_{1-x-y}Ti_xM2_y\}O_3$$

wherein M1 represents at least one metal selected from the group consisting of Zn, Ni, and Mg, M2 represents at least one metal selected from the group consisting of Pt, Fe, Bi, Rh, and Ir, and x, y, and z are defined as $0.05 \leq x \leq 0.2$, $0.00001 \leq y \leq 0.01$, and $0 \leq z \leq 0.1$, respectively.

18. An array-type ultrasonic probe according to claim 17, wherein each piezoelectric element assumes a strip shape and has, as said ultrasonic transmitting/receiving surface, a surface with the second largest area of said strip.

19. An array-type ultrasonic probe according to claim 18, wherein, in each piezoelectric element, a solid-solution quantity of lead titanate is smallest in a central portion of said ultrasonic transmitting/receiving surface and increases gradually toward end portions of said surface.

20. An array-type ultrasonic probe according to claim 17, wherein each piezoelectric element assumes a strip shape formed by slicing said piezoelectric single crystal, which assumes a rectangular shape whose four parallel edges are chamfered, in a direction perpendicular to a longitudinal direction of said chamfered portions.

21. An array-type ultrasonic probe according to claim 17, wherein each piezoelectric element assumes a strip shape formed by slicing said single crystal assuming a rectangular shape and having a cleavage plane, and has, as said ultrasonic transmitting/receiving surface, a surface with the second largest area of said strip, and said ultrasonic transmitting/receiving surface forms an angle of not more than 20° with the cleavage plane.

22. An array-type ultrasonic probe comprising:
a plurality of piezoelectric elements aligned and each having an ultrasonic transmitting/receiving surface; and
a pair of electrodes formed on the ultrasonic transmitting/receiving surface of each piezoelectric element and a surface opposite to said ultrasonic transmitting/receiving surface, respectively, and
wherein said piezoelectric element is made of a single crystal consisting essentially of a general formula:

$$Pb\{[M3_{1/2}Nb_{(1/2)-(z/2)}Ta_{z/2}]_{1-x-y}Ti_xM2_y\}O_3$$

wherein M2 represents at least one metal selected from the group consisting of Pt, Fe, Bi, Rh, and Ir, M3 represents at least one metal selected from the group consisting of Sc and In, and x, y, and z are defined as $0.2 \leq x \leq 0.6$, $0.00001 \leq y \leq 0.01$, and $0 \leq z \leq 0.1$, respectively.

23. An array-type ultrasonic probe according to claim 22, wherein each piezoelectric element assumes a strip shape and has, as said ultrasonic transmitting/receiving surface, a surface with the second largest area of said strip.

24. An array-type ultrasonic probe according to claim 23, wherein, in each piezoelectric element, a solid-solution quantity of lead titanate is a minimum in a central portion of said ultrasonic transmitting/receiving surface and increases gradually toward end portions of said surface.

25. An array-type ultrasonic probe according to claim 22, wherein each piezoelectric element assumes a strip shape formed by slicing said piezoelectric single crystal, which assumes a rectangular shape whose four parallel edges are chamfered, in a direction perpendicular to a longitudinal direction of said chamfered portions.

26. An array-type ultrasonic probe according to claim 22, wherein each piezoelectric element assumes a strip shape formed by slicing said single crystal assuming a rectangular shape and having a cleavage plane, and has, as said ultrasonic transmitting/receiving surface, a surface with the second largest area of said strip, and said ultrasonic transmitting/receiving surface forms an angle of not more than 20° with the cleavage plane.

* * * * *